US008877430B2

(12) United States Patent
Washburn et al.

(10) Patent No.: US 8,877,430 B2
(45) Date of Patent: Nov. 4, 2014

(54) METHODS OF PRODUCING STRUCTURES USING A DEVELOPER-SOLUBLE LAYER WITH MULTILAYER TECHNOLOGY

(75) Inventors: Carlton Ashley Washburn, Rolla, MO (US); James E. Lamb, III, Rolla, MO (US); Brian A. Smith, Frisco, TX (US); Justin Lee Furse, Rolla, MO (US); Heping Wang, Rolla, MO (US); Kang Le Wang, legal representative, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 337 days.

(21) Appl. No.: 13/197,941

(22) Filed: Aug. 4, 2011

(65) Prior Publication Data

US 2012/0034419 A1  Feb. 9, 2012

Related U.S. Application Data

(60) Provisional application No. 61/371,070, filed on Aug. 5, 2010.

(51) Int. Cl.
  *G03F 7/26*  (2006.01)
  *G03F 7/039*  (2006.01)
  *G03F 7/09*  (2006.01)
  *H01L 21/033*  (2006.01)

(52) U.S. Cl.
  CPC ............ *H01L 21/0332* (2013.01); *G03F 7/039* (2013.01); *G03F 7/091* (2013.01); *G03F 7/094* (2013.01)
  USPC ............................ 430/316; 430/311; 430/313

(58) Field of Classification Search
  USPC .......................................... 430/311, 313, 316
  See application file for complete search history.

(56) References Cited

U.S. PATENT DOCUMENTS

| 5,358,601 | A | 10/1994 | Cathey |
| 6,872,506 | B2 | 3/2005 | Neef et al. |
| 7,261,997 | B2 | 8/2007 | Cox et al. |
| 7,341,939 | B2 | 3/2008 | Oweyang et al. |
| 7,364,835 | B2 * | 4/2008 | Bhave et al. ............... 430/311 |
| 7,601,483 | B2 | 10/2009 | Guerrero et al. |
| 7,914,974 | B2 | 3/2011 | Guerrero et al. |
| 2007/0207406 | A1 | 9/2007 | Guerrero et al. |
| 2009/0035590 | A1 | 2/2009 | Sullivan et al. |
| 2009/0111057 | A1 | 4/2009 | Xu et al. |
| 2009/0246958 | A1 | 10/2009 | Burns et al. |
| 2010/0248487 | A1 * | 9/2010 | Lee et al. ............... 438/706 |
| 2010/0279234 | A1 | 11/2010 | Yu et al. |

FOREIGN PATENT DOCUMENTS

WO   2009/105556   8/2009

OTHER PUBLICATIONS

Yang et al., "Application of photosensitive BARC and KrF resist on implant layers," Proc. of SPIE, vol. 5376, 2004, 452-460.
Houlihan et al., "Second Generation Radiation Sensitive Developable Bottom Anti Reflective Coatings (DBARC) and Implant Resists Approaches for 193nm Lithography," Proc. of SPIE, vol. 6519, 2007, 65190L-1-65190L-8.
Lee et al., "Message to the undecided—Using DUV dBARC for 32 nm node implants," Proc. of SPIE, vol. 7273, 2009, 72730Y-1-72730Y-12.
Reilly et al., "Physical Modeling of Developable BARC at KrF," Proc of SPIE, vol. 7972, 2011, 79720Z-1-79720Z-10.
International Search Report and Written Opinion dated Mar. 28, 2012 in corresponding PCT/US2011/046547 filed on Aug. 4, 2011.
International Preliminary Report on Patentability dated Feb. 14, 2013 in corresponding PCT/US2011/046547 filed on Aug. 4, 2011.
Schram et al., "Novel Process to Pattern Selectively Dual Dielectric Capping Layers Using Soft-Mask Only," Symposium on VLSI Technology Digest of Technical Papers, 2008, 44-45.

* cited by examiner

*Primary Examiner* — Kathleen Duda
(74) *Attorney, Agent, or Firm* — Hovey Williams LLP

(57) ABSTRACT

Methods of forming microelectronic structures using multilayer processes are disclosed. The methods comprise the use of a developer-soluble protective layer adjacent the substrate surface in a multilayer stack to protect the substrate during pattern transfer. After etching, the pattern is transferred into the developer-soluble protective layer using a developer instead of etching required by previous methods. Conventional developer-soluble anti-reflective coatings and gap-fill materials can be used to form the protective layer. Custom layers with developer solubility can also be prepared. Microelectronic structures formed by the above processes are also disclosed.

18 Claims, 13 Drawing Sheets

(H)

(I)

METHODS OF PRODUCING STRUCTURES USING A DEVELOPER-SOLUBLE LAYER WITH MULTILAYER TECHNOLOGY

CROSS-REFERENCE TO RELATED APPLICATIONS

The present application claims the priority benefit of U.S. Provisional Patent Application Ser. No. 61/371,070, filed Aug. 5, 2010, entitled, NOVEL WAY TO PRODUCE STRUCTURES USING A DEVELOPER-SOLUBLE LAYER WITH MULTILAYER TECHNOLOGY, incorporated by reference in its entirety herein.

BACKGROUND OF THE INVENTION

1. Field of the Invention

The present invention relates to methods of using a developer-soluble protective layer under a carbon underlayer in a multilayer stack and the microelectronic structures thereof.

2. Description of Related Art

As the semiconductor industry continues to push the boundaries of lithographic techniques, methods to make successively smaller features have been developed. One of these methods is multilayer processing.

Multilayer processes are quickly becoming the standard process at critical pattern levels because they allow a thin imaging layer without significant loss of resolution or increase in feature roughness. A typical multilayer stack includes a planarizing carbon-rich layer (e.g., carbon hardmask, amorphous carbon, or spin-on carbon layer) on the substrate surface, a pattern transfer layer (e.g., hardmask or spin-on glass) adjacent the carbon-rich layer, and an imaging layer (e.g., photoresist) adjacent the pattern transfer layer (i.e., "on top of" the entire stack). An anti-reflective coating may sometimes be present underneath the imaging layer. Typical lithographic processes are used to form a pattern on the imaging layer, which is then etched down into the substrate. The alternating stack allows for selective etching between layers. The pattern is first transferred to the pattern transfer layer using a reactive-ion etch (RIE), typically with a fluorocarbon etch gas (e.g., $CF_4$ or $CHF_3$), along with $O_2$ or other gases to tune the profile. This pattern is then transferred into the underlying carbon layer, typically in an oxygen-based etch, such as $O_2$, $O_2/N_2$, CO, or $CO_2$ depending on the desired level of anisotropy. These successive pattern transfers ensure enough mask thickness to etch deeply into the device layer, without as much critical dimension (CD) loss and roughness as would occur using only a single layer of relatively thicker or slower-etching bottom anti-reflective coating underneath the imaging layer. The drawbacks to multilayer processing are the added complexity and the need to control profile through multiple layers so that the etch bias of the pattern is not excessive. At the gate level, especially high-k/metal-gate integration (HKMG), some care must also be taken to avoid damaging the gate oxide. This limits some dry etch choices where oxidation of the high-k dielectric or other forms of plasma damage might occur. These successive etches can also have detrimental effects. Repeated etching can deteriorate the pattern from both loss of fidelity and changes in profiles due to the partial isotropic nature of RIE. Since multilayer processes are also used in gate level patterning, there is concern about stochastic damage. An example of this sort of stochastic damage is the oxidization of metal gates on the substrate by the etch gas.

A variety of etch processes have been developed and tuned to minimize the challenges listed above, but they still rely on etch tuning. If a process could be developed to allow the use of a broader range of gases, while protecting the substrate from etch damage, it would mitigate the challenges that multilayer processing schemes are currently facing with the multiple etches.

Part of the manufacturing of an integrated circuit chip is to dope the silicon substrate to change its electrical characteristics. This is typically performed by driving ions into the surface of the wafer ("ion implantation"), then heating the wafer to allow the new elements to become electrically active. A protective mask is usually formed using photolithography to ensure the ions are only implanted in the desired (open) areas, while blocking the ions from being implanted in other (covered) areas. Until recently, an anti-reflective coating and a photoresist layer were sufficient to shield the substrate from the ion implant step. However, as feature sizes shrink, photoresist layers have become thinner and thinner to achieve better resolution and control. This requires the introduction of additional layers, such as hardmasks, to the stack. Likewise, the ion implant step becomes more and more difficult, as the thickness of material necessary to shield the substrate from ions does not change, but the size of features and the spacing between them continues to shrink. This causes an increase in the aspect ratio of the features thus raising the aspect ratio of the photoresist, and necessitating new processing methods. In addition, as this aspect ratio increases, the stability of the structures decreases. This loss of stability can lead to line collapse, or other failures.

The implant process has faced two major challenges, namely, sensitive substrates and increasing aspect ratios. In some cases, the wafer has a layer of silicon oxide placed under the lithography stack to scatter the incoming ions. In some cases, such a scattering layer cannot be used. In these cases, the substrate is usually sensitive, and processes (mostly RIE) used to remove inorganic layers (e.g., anti-reflective coatings) in the stack will damage the substrate. Coatings that can be removed with alternative processes would help solve these problems.

However, even with anti-reflective coatings, the increase in aspect ratio makes removal of the coating from between the features more difficult. Many methods have been proposed to aid in removing this residue. One such method is to coat the patterned anti-reflective coating and photoresist with a second layer of developer-soluble material, and then develop all three layers away in a second cleaning step. In another method, an electric field is applied to the structure before or during the post exposure bake (PEB) to help create features with better sidewalls. However, the proposed solutions are complicated and require additional materials or complicated processing steps to achieve effective removal of anti-reflective coating material from small features.

Thus, there remains a need in the art for improved materials and processes of creating microelectronic structures.

SUMMARY OF THE INVENTION

The present invention is broadly concerned with methods of forming microelectronic structures using multilayer processing. In one aspect, a method of forming a microelectronic structure is provided. The method comprises providing a microelectronic substrate having a surface, forming a developer-soluble protective layer on the substrate surface, and forming a carbon-rich layer adjacent the developer-soluble protective layer.

A further method of forming a microelectronic structure is provided. The method comprises providing a multilayer stack comprising a substrate having a surface, a developer-soluble protective layer adjacent the substrate surface, and a patterned carbon-rich layer adjacent the developer-soluble protective layer. The pattern is then transferred into said developer-soluble protective layer by contacting the developer-soluble protective layer with a developer to remove a portion thereof from the substrate surface.

The invention is also concerned with a microelectronic structure comprising a microelectronic substrate having a surface, a developer-soluble protective layer adjacent the substrate surface, a carbon-rich layer adjacent the developer-soluble protective layer.

DETAILED DESCRIPTION

Methods of the Invention

Figure 1:
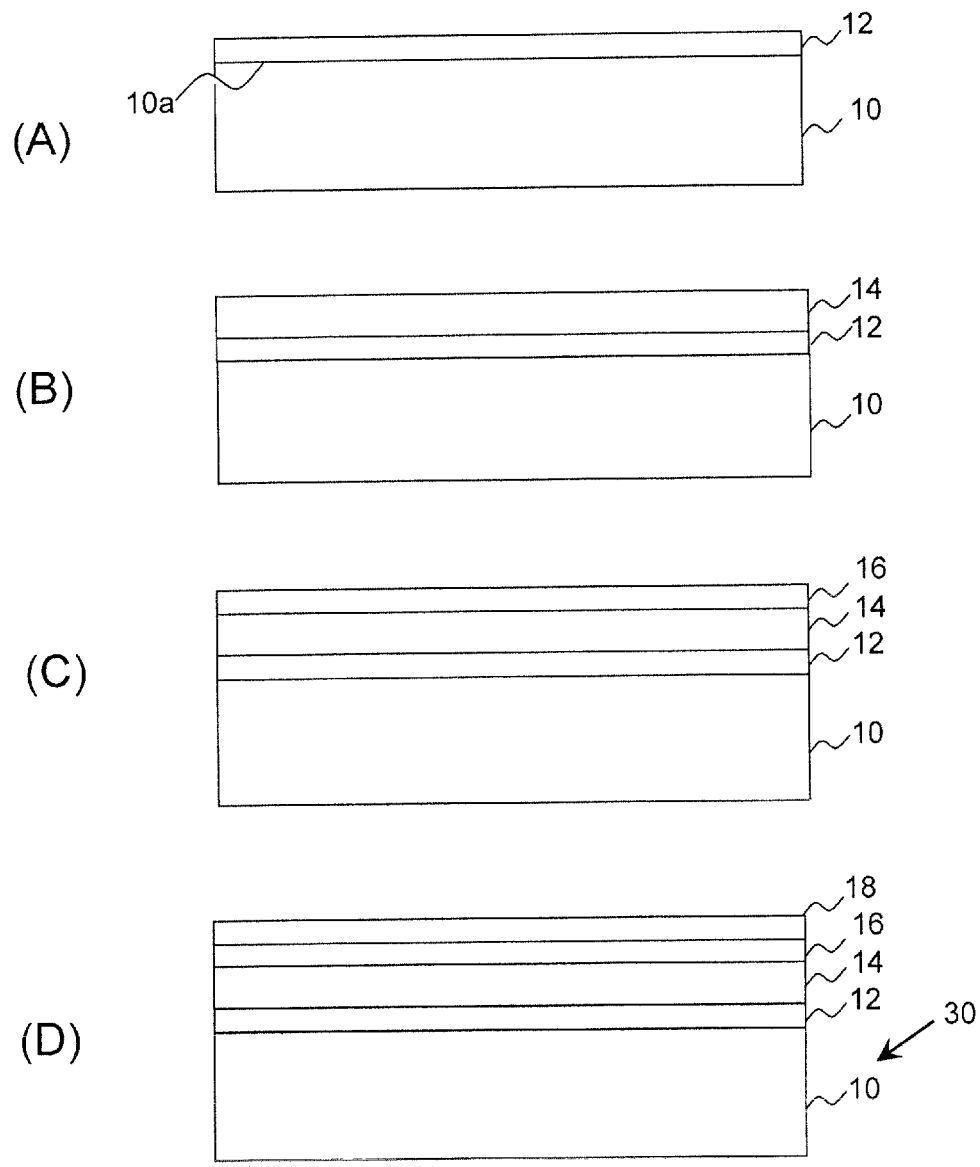
FIG. 1 is a schematic drawing depicting a structure (not to scale) formed by the inventive process.
Figure 1:
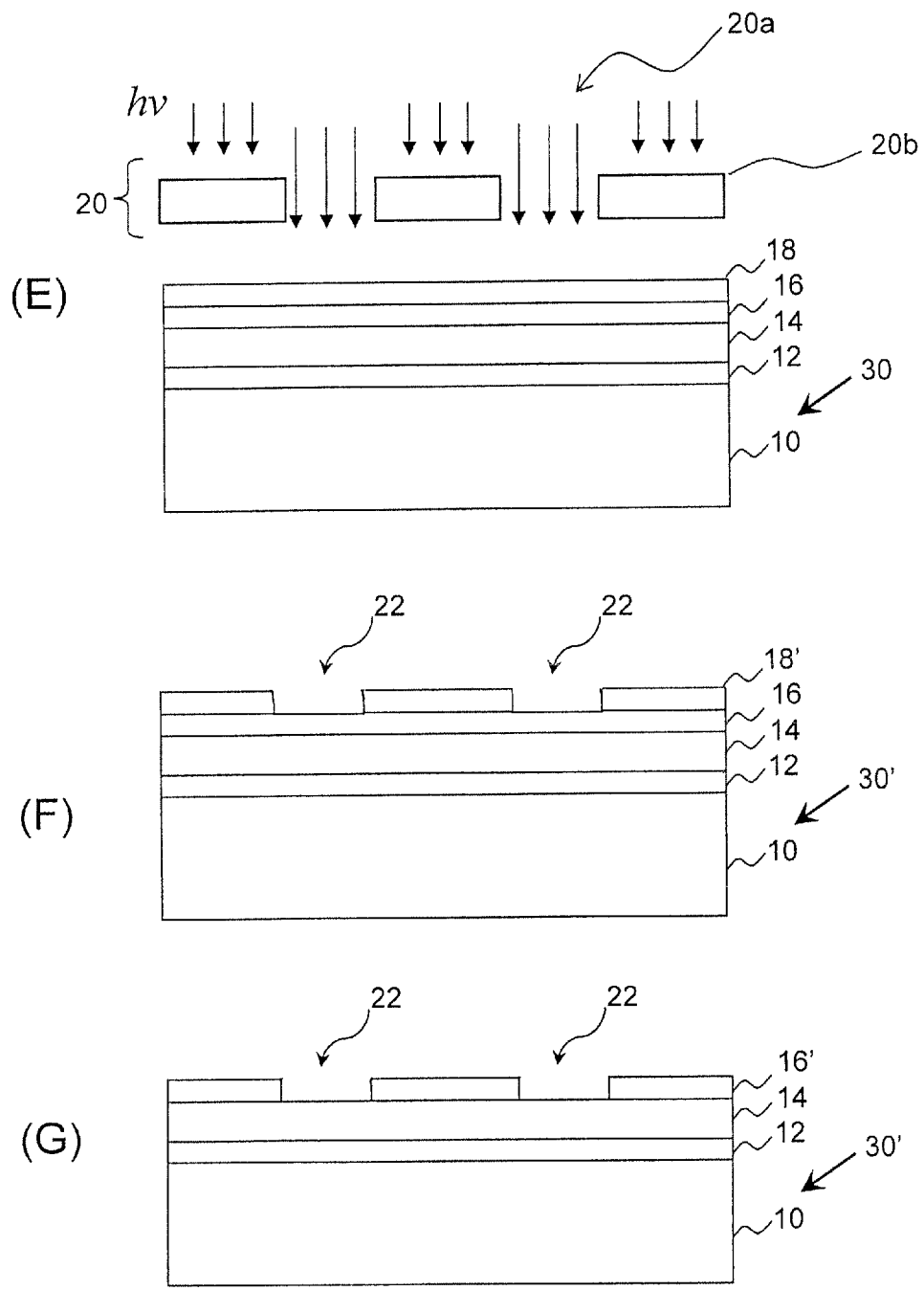
Figure 1:
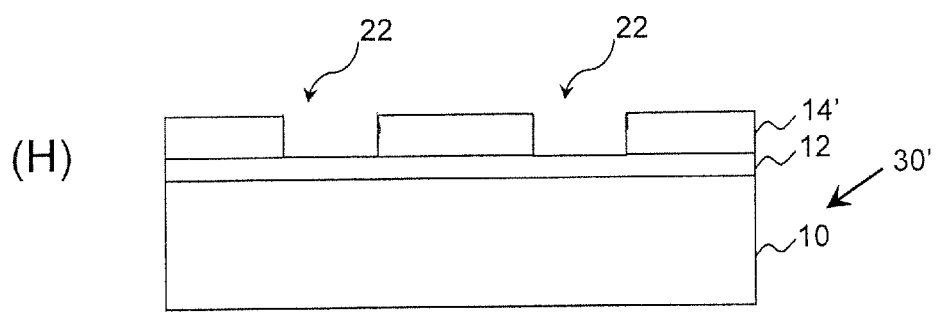
Figure 1:
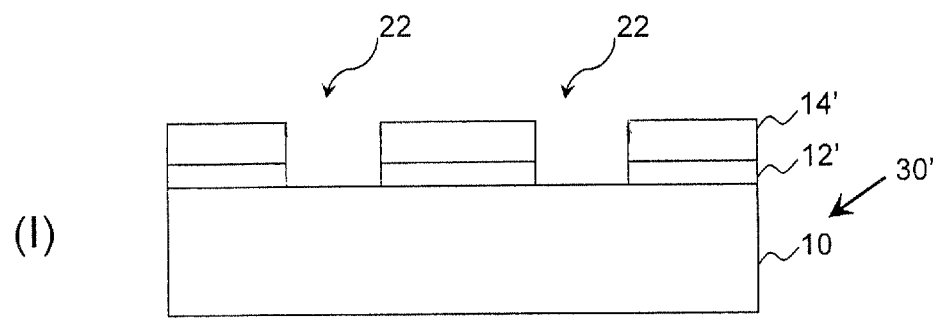

In more detail, the present invention provides methods of forming microelectronic structures and is particularly suited for multilayer processes. FIG. 1 illustrates the formation of a multilayer stack and processing according to a preferred embodiment of the invention. While the drawings illustrate, and the specification describes, certain preferred embodiments of the invention, it is to be understood that such disclosure is by way of example only. Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. There is no intent to limit the principles of the present invention to the particular disclosed embodiments. For example, in the drawings, the size and relative sizes of layers and regions may be exaggerated for clarity. In addition, embodiments of the present invention should not be construed as limited to the particular shapes of regions illustrated herein but are to include deviations in shapes that result, for example, from manufacturing. For example, an etched region illustrated as a rectangle may have rounded or curved features. Thus, the regions illustrated in the figures are schematic in nature and their shapes are not intended to illustrate the precise shape of a region of a device and are not intended to limit the scope of the present invention.

In the inventive method, as shown in FIG. 1(A), a substrate 10 having a surface 10a is provided. Any conventional microelectronic substrate can be utilized. Preferred substrates include those selected from the group consisting of silicon, SiGe, $SiO_2$, $Si_3N_4$, SiON, aluminum, tungsten, tungsten silicide, gallium arsenide, germanium, tantalum, tantalum nitride, coral, black diamond, phosphorous or boron doped glass, $Ti_3N_4$, hafnium, $HfO_2$, ruthenium, indium phosphide, and mixtures of the foregoing. The substrate surface 10a can be planar, or it can include topography features (via holes, trenches, contact holes, raised features, lines, etc.). As used herein, "topography" refers to the height or depth of a structure in or on a substrate surface.

A developer-soluble composition is applied to the substrate 10 to form a developer-soluble protective layer 12 on the substrate surface 10a, as shown in FIG. 1(a). Preferably, the developer-soluble protective layer 12 is formed directly adjacent the substrate surface 10a (i.e., without any intermediate layers between the developer-soluble protective layer 12 and substrate 10). The composition can be applied by any known application method, with one preferred method being spin-coating the composition at speeds of from about 500 rpm to about 5,000 rpm (preferably from about 1,000 rpm to about 2,000 rpm) for a time period of from about 5 seconds to about 120 seconds (preferably from about 30 seconds to about 60 seconds). After the composition is applied, it is preferably heated to a temperature of from about 160° C. to about 205° C., and more preferably from about 170° C. to about 185° C. and for time periods of from about 10 seconds to about 120 seconds (preferably from about 30 seconds to about 60 seconds) to evaporate solvents. Depending upon the composition used to form the developer-soluble layer 12, baking can also initiate a crosslinking reaction to cure the layer 12. The baking process can then be quenched using a chill plate at from about 10° C. to about 25° C. (preferably from about 19° C. to about 23° C.), for time periods of about 10 seconds to about 90 seconds. It will be appreciated by those in the art that in each of the baking steps used to form the layers as described below, a chill plate (~19-23° C.) can be used to quench the baking process before proceeding with subsequent processing of the stack.

The average thickness of the developer-soluble protective layer 12 (determined after baking) is preferably from about 1 nm to about 200 nm, more preferably from about 10 nm to about 70 nm, and most preferably from about 30 nm to about 40 nm. If the substrate surface 10a includes topography, the developer-soluble protective layer 12 is preferably applied at a thickness sufficient to substantially cover the substrate topography and to achieve the above average thicknesses over the topography. Depending upon the composition used to form the developer-soluble layer 12 (discussed in more detail below), the dried or crosslinked developer-soluble layer 12 can have a refractive index (n value) of from about 0.1 to about 2.5, more preferably from about 1 to about 2, and even more preferably from about 1.6 to about 1.8 at the wavelength of use (e.g., 365 nm, 248 nm, 193 nm, 157 nm, or 13.5 nm, with 193 and 248 nm being the most preferred). The dried or crosslinked developer-soluble layer 12 can also have an extinction coefficient (k value) of from about 0 to about 1, more preferably from about 0.3 to about 0.6, and even more preferably from about 0.4 to about 0.5 at the wavelength of use (e.g., 365 nm, 248 nm, 193 nm, 157 nm, or 13.5 nm, with 193 and 248 nm being the most preferred).

The dried or crosslinked developer-soluble protective layer 12 in some embodiments will be substantially insoluble in typical organic solvents used to form subsequent layers in the multilayer stack, such as propylene glycol methyl ether acetate (PGMEA), propylene glycol monomethyl ether (PGME), ethyl lactate, propylene glycol n-propyl ether, gamma-butyrolactone, cyclopentanone, cyclohexanone, n-butyl acetate, methyl isobutyl carbinol (MIBC), and mixtures thereof. Thus, when subjected to a stripping test, the developer-soluble layer 12 will have a percent stripping of less than about 5%, preferably less than about 1%, and more preferably about 0%. The stripping test involves first determining the thickness by taking the average of measurements at five different locations of the layer. This is the initial average film thickness. Next, the film is rinsed with a solvent (e.g., ethyl lactate) for about 30 seconds, followed by spin drying at about 500-3,000 rpm for about 20-60 seconds to remove the solvent. The thickness is measured again at those five points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

Although typically insoluble in organic solvents, the developer-soluble layer 12 is soluble or capable of being rendered soluble in conventional aqueous developers (e.g., photoresist developers). That is, the term "developer-soluble" as used herein means that the layer 12 is capable of being removed with conventional aqueous developers (e.g., hydroxides and/or any alkaline/base chemistry solutions). Particularly preferred developers are selected from the group consisting of tetramethyl ammonium hydroxide (TMAH), potassium hydroxide (KOH), sodium hydroxide, and mixtures thereof. In some embodiments, the developer-soluble layer 12 is photosensitive and is rendered soluble in developer only upon exposure to radiation (e.g., light). For example, when a cured (or crosslinked) developer-soluble layer 12 is used, the layer 12 will also be insoluble in typical developers until exposed to radiation to decrosslink the layer 12. In other embodiments, the developer-soluble layer 12 is not photosensitive (i.e., a pattern cannot be defined in the layer when it is exposed to about 1 J/cm$^2$). That is, the developer-soluble layer 12 does not undergo any physical or chemical change during exposure to radiation (i.e., light). Thus, the developer-soluble layer 12 does not need to be exposed to radiation to be rendered soluble in developer. Regardless of the embodiment, the developer-soluble layer 12 advantageously can be removed during processing without dry etching (e.g., reactive ion etching), and is preferably not subjected to any dry etching in the method of the invention.

After formation of the developer-soluble layer 12 on the substrate surface 10a, a carbon-rich layer 14 can be formed adjacent (i.e., on top of) the developer-soluble layer 12, as shown in FIG. 1(B). The carbon-rich layer 14 can be formed by any known application method, with one preferred method being spin-coating at speeds of from about 1,000 to about 5,000 rpm (preferably from about from about 1,250 to about 1,750 rpm) for a time period of from about 30 to about 120 seconds (preferably from about 45 to about 75 seconds). The term "carbon-rich," as used herein, refers to layers formed from compositions comprising greater than about 50% by weight carbon, preferably greater than about 70% by weight carbon, and more preferably from about 75 to about 80% by weight carbon, based upon the total solids in the composition taken as 100% by weight. Suitable carbon-rich layers are selected from the group consisting of spin-on carbon layers (SOC), amorphous carbon layers, and carbon planarizing layers. Exemplary carbon-rich compositions will generally comprise a polymer dispersed or dissolved in a solvent system, along with the following optional ingredients: acid and/or base quenchers, catalysts, crosslinking agents, and surface modification additives. Preferred compositions will be suitable for forming thick layers and preferably have a solids content of from about 0.1% to about 70%, more preferably from about 5% to about 40%, and more preferably from about 10% to about 30% by weight, based upon the total weight of the composition taken as 100% by weight. After the carbon-rich composition is applied, it is preferably heated to a temperature of from about 100° C. to about 300° C., and more preferably from about 160° C. to about 205° C. and for a time period of from about 30 seconds to about 120 seconds (preferably from about 45 seconds to about 60 seconds) to evaporate solvents. For very thick layers 14 (e.g., >500 nm), a two-stage bake can be used by first heating the layer to a temperature of from about 50° C. to about 200° C. (preferably from about 100° C. to about 150° C.) for a time period of from about 30 seconds to about 120 seconds (preferably from about 45 seconds to about 60 seconds), followed by heating the layer to a temperature of from about 160° C. to about 300° C. (preferably from about 180° C. to about 205° C.) for a time period of from about 30 seconds to about 120 seconds (preferably from about 45 seconds to about 60 seconds) to fully cure across the thickness of the layer 14. The thickness of the carbon-rich layer 14 after baking is preferably from about 10 nm to about 50,000 nm, more preferably from about 100 nm to about 5,000 nm, and even more preferably from about 1,000 nm to about 3,000 nm. The carbon-rich layer 14 is preferably not photosensitive (as defined above), and thus, photosensitive compositions such as photoresists or other imaging layers are not suitable for use as carbon-rich layers of the invention.

In some embodiments, an intermediate etch block layer can be optionally formed between the carbon-rich layer 14 and developer-soluble layer 12 (not shown). When present, the etch block layer is preferably comprised of carbon compounds, metal compounds, or silicon compounds (e.g., $Si_3N_4$, $SiO_2$, SiC, or SiON). The thickness of the etch block layer will vary, but is preferably from about 0.1 nm to about 100 nm, more preferably from about 1 nm to about 20 nm, and even more preferably from about 5 nm to about 10 nm. In other embodiments when an intermediate etch block layer is not present, the carbon-rich layer 14 is formed directly on top of the developer-soluble layer 12 as shown in FIG. 1(B). That is, there are no other layers between the developer-soluble layer 12 and the carbon-rich layer 14.

A pattern transfer layer 16 is then formed adjacent the carbon-rich layer 14, as shown in FIG. 1(C). The pattern transfer layer 16 can be formed by any known application method, with one preferred method being spin-coating at speeds of from about 1,000 to about 5,000 rpm (preferably from about from about 1,000 to about 2,000 rpm) for a time period of from about 30 to about 120 seconds (preferably from about 45 to about 60 seconds). Chemical vapor deposition can also be used to form the pattern transfer layer 16. The pattern transfer layer 16 can then be heated to a temperature of from about 100° C. to about 300° C., and more preferably from about 160° C. to about 205° C. and for a time period of from about 30 seconds to about 120 seconds (preferably from about 45 seconds to about 60 seconds) to evaporate solvents. The thickness of the pattern transfer layer 16 after baking is preferably from about 1 nm to about 1,000 nm, more preferably from about 20 nm to about 100 nm, and even more preferably from about 30 nm to about 50 nm. Suitable compositions for use in forming the pattern transfer layer 16 include hardmask materials (e.g., silicon- or metal-containing hardmasks and hybrid hardmasks) or spin-on glass materials (e.g., silicates, phosphosilicates, siloxanes).

An imaging layer 18 is then formed adjacent the pattern transfer layer 16. The resulting stack 30 is shown in FIG. 1(D). The imaging layer 18 can be formed by any known application method, with one preferred method being spin-coating at speeds of from about 500 to about 5,000 rpm (preferably from about from about 1,000 to about 2,000 rpm) for a time period of from about 30 to about 120 seconds (preferably from about 45 to about 60 seconds) onto the pattern transfer layer 16. The imaging layer 18 is then post-application baked at a temperature of at least about 90° C., and preferably from about 90° C. to about 130° C., for time periods of from about 30 seconds to about 120 seconds (preferably 45 to about 60 seconds). Suitable imaging compositions include commercially-available photoresists (e.g., TArF Pi6-001 from TOK, Kawasaki shi, Kanagawa (Japan); ARX3001, ARX3340J, AM2073J, and KrFM592Y from JSR Micro, Sunnyvale, Calif.; SAIL-X-181, Shin-Etsu, Tokyo (Japan)) or any other photosensitive compositions. The inventive methods permit the use of much thinner imaging layers 18. The thickness of the imaging layer 18 is less than about 500 nm, preferably less than about 300 nm, more preferably from about 50 nm to about 200 nm, and even more preferably from about 100 nm to about 180 nm. It will be appreciated that a conventional anti-reflective coating could also be present in the stack between the pattern transfer layer 16 and the imaging layer 18 to control reflection during exposure of the imaging layer (not shown).

In an alternative embodiment, the adhesive properties of any of the layers described above can be enhanced by treating the layer surface with an adhesion promoter. An exemplary adhesion promoter suitable for this purpose is hexamethyldisilazane (HMDS). When used, the adhesion promoter can be applied using conventional spin-coating with a diluted solution of the adhesion promoter in solvent (e.g., PGMEA) or vapor priming of undiluted adhesion promoter using a vacuum oven to change the surface properties of the treated layer, followed by baking at about 100 to about 205° C. for about 30 to about 60 seconds. In either case, treatment improves the adhesion of the layers.

As shown in FIG. 1(E), the imaging layer 18 can then be patterned by exposure to light of the appropriate wavelength. More specifically, the imaging layer 18 is exposed using a mask 20 positioned above the imaging layer 18. The mask 20 has open areas 20*a* designed to permit radiation (hv) to pass through the mask 20 and contact the imaging layer 18. The remaining solid portions 20*b* of the mask 20 are designed to prevent radiation from contacting the imaging layer 18 in certain areas. Those skilled in the art will readily understand that the arrangement of open areas 20*a* and solid portions 20*b* is designed based upon the desired pattern to be formed in the imaging layer 18 and ultimately in the substrate 10.

Although an anti-reflective layer can be present under the imaging layer 18 in the stack 30, as explained above, in some embodiments, the pattern transfer layer 16 and carbon-rich layer 14. eliminate the need for an anti-reflective layer under the imaging layer 18 to control reflection during the exposure process. Regardless of the embodiment, after exposure, the imaging layer 16 is preferably subjected to a post-exposure bake at a temperature of from about 90° C. to about 150° C., more preferably from about 110° C. to about 130° C., for a time period of from about 30 seconds to about 120 seconds.

Upon exposure, the portions of the imaging layer 18 that are exposed to radiation are rendered soluble in aqueous developer. As shown in FIG. 1(F), the exposed portions of the imaging layer 18 which were made soluble by the above process, are then contacted with an aqueous developer to remove the exposed portions to form the desired pattern 22 in the imaging layer 18 to yield a patterned imaging layer 18'. The pattern 22 can be via holes, trenches, lines, spaces, etc., that will ultimately be transferred to the substrate 10 using an etch or ion implantation process or metal deposition. Alternatively, the exposed portions of the imaging layer 18 can be rendered insoluble during the exposure process, in which case, the removal process is reversed from what is described above. That is, the unexposed portions are removed during development to form the pattern (not shown). In either embodiment, at least about 95% of the exposed (or unexposed as the case may be) portions of the imaging layer 18 will preferably be removed by the developer, more preferably at least about 99%, and even more preferably about 100% will be removed. Suitable developers are organic or inorganic alkaline solutions such as KOH or TMAH, and preferably comprise an aqueous solution of TMAH at a concentration of about 0.26N. Some of these developers are commercialized under the tradenames PD523AD (available from Moses Lake Industries, Inc., Moses Lake, Wash.), MF-319 (available from Shipley, Mass.), MF-320 (available from Shipley), and NMD3 (available from TOK, Japan).

In a conventional lithography process, the medium through which the radiation passes from the radiation source to the imaging layer 18 during exposure is air. The present method is particularly suited to immersion lithography wherein the medium through which the radiation passes during exposure in the present method is preferably a liquid. More preferably, the imaging layer 18 is exposed to radiation via an optical projection element (i.e., lens) of a lithographic system, with the immersion liquid contacting at least a portion of the optical element of the lithographic system and a portion of inventive microelectronic structure (i.e., the multilayer stack 30). Even more preferably, the liquid fills the space between the last optical element in the system and the multilayer stack 30, such that the optical element is immersed in the liquid. Suitable immersion liquids preferably have a refractive index greater than 1 (preferably from about 1 to about 2, and more preferably from about 1.3 to about 1.4), and are selected from the group consisting of water (preferably purified water), organic solvents, and mixtures thereof. Immersion lithography systems are known in the art and include the Amphibian Interferometer from Amphibian™ Systems (Rochester, N.Y.).

It will also be appreciated that other patterning methods may also be used, including emerging technologies, such as imprint lithography, nano-imprint lithography, hot embossing lithography, and stamping pattern transfer to form the pattern 22 into imaging layer 18. These technologies use a patterned mold to transfer patterns instead of relying on photolithographic patterning, as described above. Directed self-assembly (DSA) could also be used to pattern the imaging layer 18.

Regardless of how the pattern 22 is formed in the imaging layer 18, an etching process is then used to transfer the pattern 22 from the patterned imaging layer 18' into the pattern transfer layer 16 to yield a patterned pattern transfer layer 16', as shown in FIG. 1(G). Preferably, RIE is used to transfer the pattern 22 using a reactive ion plasma of $CF_4$, $CHF_3$, $O_2$, HBr, $Cl_2$, $SF_6$, $C_2F_8$, CO, $CO_2$, $N_2$, $H_2$, $C_4H_8$, Ar, $N_2H_2$, He, $CH_2F_2$, or a mixture thereof. Etching is the pattern 22 from the patterned pattern transfer layer 16' into the carbon-rich layer 14, as shown in FIG. 1(H) to yield a patterned carbon-rich layer 14'. Preferably, RIE is used to transfer the pattern 22 into the carbon-rich layer 14 using a reactive ion plasma of $CF_4$, $CHF_3$, $O_2$, HBr, $Cl_2$, $SF_6$, $C_2F_6$, $C_4F_8$, CO, $CO_2$, $N_2$, $H_2$, $C_4H_8$, Ar, $N_2H_2$, He, $CH_2F_2$, or a mixture thereof.

When present, etching is then used to break through the etch block layer and expose the developer-soluble protective layer 12 (not shown). When no etch block is present in the stack 30 (as shown in FIG. 1), transferring the pattern 22 into the carbon-rich layer 14 uncovers portions of the developer-soluble protective layer 12, as shown in FIG. 1(H), that were adjacent the removed portions of the patterned carbon-rich layer 14'.

The pattern 22 is then transferred into the developer-soluble protective layer 12 as shown in FIG. 1(I). Preferably, the developer-soluble protective layer 12 is contacted with a developer to remove the uncovered portions from the substrate surface 10a, which correspond to pattern 22, to yield a patterned developer-soluble protective layer 12'. Preferably, the developer-soluble protective layer 12 is contacted with developer for time periods of from about 1 to about 120 seconds, more preferably from about 10 to about 60 seconds, and even more preferably from about 30 to about 40 seconds. The developer-soluble layer 12 can be contacted with the developer by any suitable method, including puddling the developer on the patterned stack 30', spraying the developer over the surface of the patterned stack 30', or immersing the stack 30' into the developer. After contacting the developer-soluble protective layer 12 with developer, the developer can be rinsed with deionized water, followed by spin drying at about 1,000 to about 5,000 rpm (preferably about 1,200 rpm to about 2,500 rpm) for about 30 to about 120 seconds (preferably for about 45 to about 90 seconds). In embodiments where the developer-soluble protective layer 12 is photosensitive (i.e., undergoes a reaction when exposed to activating radiation), the developer-soluble protective layer 12 is first exposed to radiation using carbon-rich layer 14' as a mask to yield exposed portions of the developer-soluble protective layer corresponding to the portions uncovered upon etching of the carbon-rich layer 14. In some embodiments, the photosensitive developer-soluble protective layer 12 is "decrosslinked" upon exposure to radiation to render it soluble in developer. That is, the bond that was formed upon crosslinking is broken. Regardless, this results in exposed and unexposed portions of the developer-soluble protective layer 12 having different dissolution rates, allowing the exposed portions to be removed without removing the unexposed portions. In aspects where the developer-soluble protective layer 12 is not photosensitive (i.e., the solubility of the layer 12 unaffected by exposure to radiation), the entire layer will develop at the same rate. However, portions covered by the carbon-rich layer 14' are protected from developer removal, resulting in only the uncovered portions of the developer-soluble layer 12 being removed.

In embodiments where high aspect ratio patterns are formed, megasonic energy can be used to help clear the developer-soluble protective layer 12 from the bottom of the features that make up the pattern 22 (not shown). In this process, megasonic energy is applied to the stack 30' while contacting the developer-soluble protective layer 12 with the developer. This helps agitate the developer and speeds up the acid/base reaction to dissolve the developer-soluble protective layer 12. Suitable equipment for carrying out these processes are known in the art and include a dual zone 200/300 mm Megpie transducer which pumps developer onto the stack while the Megpie applies megasonic energy. This process of flowing developer and megasonic energy continues until the development process is complete. The removal process is then stopped by flowing deionized water across the stack, followed by spin drying as described above.

It will be appreciated that in some embodiments, a solvent can be used to "develop" the developer-soluble protective layer 12 in lieu of traditional aqueous developers. Solvent removal can be particularly beneficial in the formation of high aspect ratios and very small spaces. In these embodiments, the solvent resistance of the dried or crosslinked developer-soluble layer 12 can be varied by adjusting the amount of crosslinking in the layer. For example, the layer 12 can be formulated to be resistant to solvents used to form subsequent layers (such as the carbon-rich layer) to avoid intermixing of the layers, while remaining soluble in certain other solvents, which can be used to dissolve the developer-soluble layer 12 away during pattern transfer. Such techniques are known in the art. Suitable solvents that can be used to remove the developer-soluble protective layer 12 (depending upon the composition used to form the layer 12) include PGME, PGMEA, ethyl lactate, cyclopentanone, cyclohexanone, MIBC, methyl ethyl ketone (MEK), n-butyl acetate, heptanones, or a mixture thereof. The developer-soluble protective layer 12 is contacted with the solvent to remove the uncovered portions from the substrate surface 10a, using the same procedures as described for developer removal above.

Regardless of the embodiment, removal of the developer-soluble protective layer 12 (whether by developer or solvent) yields a patterned developer-soluble layer 12'. As can be seen in FIG. 1(I), the pattern forms openings 22 (such as a contact hole, via hole, trench, etc.) in both the patterned developer-soluble layer 12' and patterned carbon-rich layer 14' that are in substantial communication or alignment with one another (i.e., aligned to at least some extent such that the vias or contact holes, for example, would line up so that substrate 10 is exposed). Further processing can then be carried out on the exposed portions of the substrate, or the pattern 22 can be transferred down into the substrate surface (not shown).

For example, for ion implantation, ions are generated from a dopant by an ion source using known processes (not shown). Some preferred ions for use with the present invention are those selected from the group consisting of ions of the elements of Groups III-V of the Periodic Table, with ions of boron, nitrogen, phosphorus, arsenic, boron difluoride, indium, antimony, germanium, silicon, carbon, and gallium being particularly preferred. Other preferred ions are selected from the group consisting of hydrogen, argon, beryllium, fluorine, oxygen, and helium. The generated ions are accelerated at energy levels sufficiently high that the ions will penetrate the substrate. Preferred energy levels are from about 1 eV to about 20 MeV, preferably from about 5 KeV to about 2,000 KeV, and more preferably from about 20 KeV to about 500 KeV. Typical ion doses would be from about 10 atoms/cm² to about $10e^{30}$ atoms/cm², and preferably from about $1e^{12}$ atoms/cm² to about $1e^{16}$ atoms/cm². The accelerated ions are focused by known processes. One such process involves using a series of electrostatic and magnetic lenses until the beam reaches the desired diameter. The beam is then directed at the substrate. As will be understood by those skilled in this art, the angle of the beam can be adjusted to control ion depth in the substrate. As shown in FIG. 1(I), the carbon-rich layer 14' and developer-soluble protective layer 12' serve to protect areas of substrate 10 where ions are not desired, while the openings of pattern 22 provide access to the substrate 10 by the ions. As a result, an implant area can be formed in the substrate that corresponds to the pattern 22 (not shown).

It will be appreciated that FIG. 1 depicts only a small section of the overall structure 10. Thus, patterned carbon-rich layer 14' and developer-soluble protective layer 12' may have a number of openings formed therein. These openings can be adjusted to the size and shape necessary to implant ions in the substrate in the locations appropriate for the end use.

Developer-Soluble Compositions for Use in the Invention

The compositions utilized can be any suitable compositions soluble in developer or capable of being rendered developer-soluble upon exposure to radiation, including conventional anti-reflective coatings, gap-fill compositions, or custom-formulated compositions. The preferred compositions will include a moiety that confers solvent strip resistance to prevent intermixing with subsequent layers, a base soluble group or group capable of being rendered base soluble, and optionally a leaving group (e.g., acid labile group).

The compositions will typically comprise a compound dispersed or dissolved in a solvent system. The compound will generally be selected from the group consisting of polymers, oligomers, and mixtures thereof. Particularly preferred compounds are selected from the group consisting of polyamic acids, acrylates, methacrylates, polyesters, and mixtures thereof. The compound is preferably present in the composition at a level of from about 0.1 to about 10% by weight, preferably from about 0.5 to about 2% by weight, and more preferably from about 0.7 to about 1.2% by weight, based upon the total weight of all ingredients in the composition taken as 100% by weight. If the compound is a polymer, it is preferred that the average molecular weight be from about 1,000-100,000 Daltons, and more preferably from about 1,000-25,000 Daltons, If the compound is an oligomer, it is preferred that the molecular weight be from about 500-3,000 Daltons, and more preferably from about 500-1,500 Daltons.

Preferred polymers in some embodiments will comprise an acid functional group. The acid group is preferably present in the compound at a level of at least about 5% by weight, preferably from about 5-90% by weight, and even more preferably from about 5-50% by weight, based upon the total weight of the compound taken as 100% by weight. Preferred acid groups include phenolics, carboxylic acids (—COOH), and mixtures thereof, although in some embodiments phenolics are excluded.

Particularly preferred polyamic acids include recurring monomers having the formulas

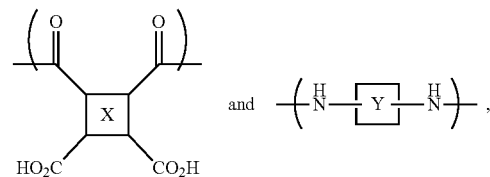

where each of

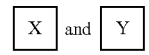

is individually selected from the group consisting of aliphatic and aryl groups. Particularly preferred X and Y groups include those selected from the group consisting of substituted and unsubstituted phenyl, biphenyl, naphthyl, and anthryl groups, and substituted and unsubstituted $C_1$-$C_{12}$ aliphatic (preferably alkyl) groups. These can be formed by polymerizing a dianhydride with a diamine. The synthesis of these polymers and suitable developer-soluble compositions comprising these polymers is described in U.S. Pat. Nos. 7,261,997 and 7,364,835, incorporated by reference herein in their entirety.

Particularly preferred polyamic acids for use in the composition comprise recurring monomers selected from the group consisting of

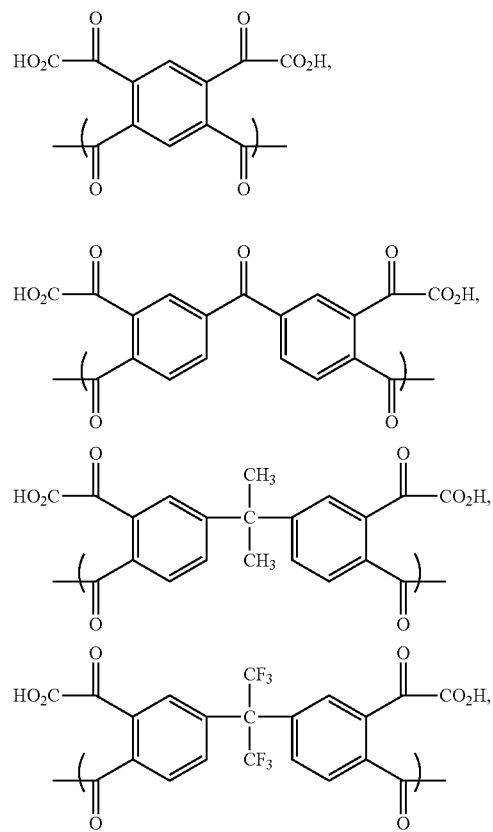

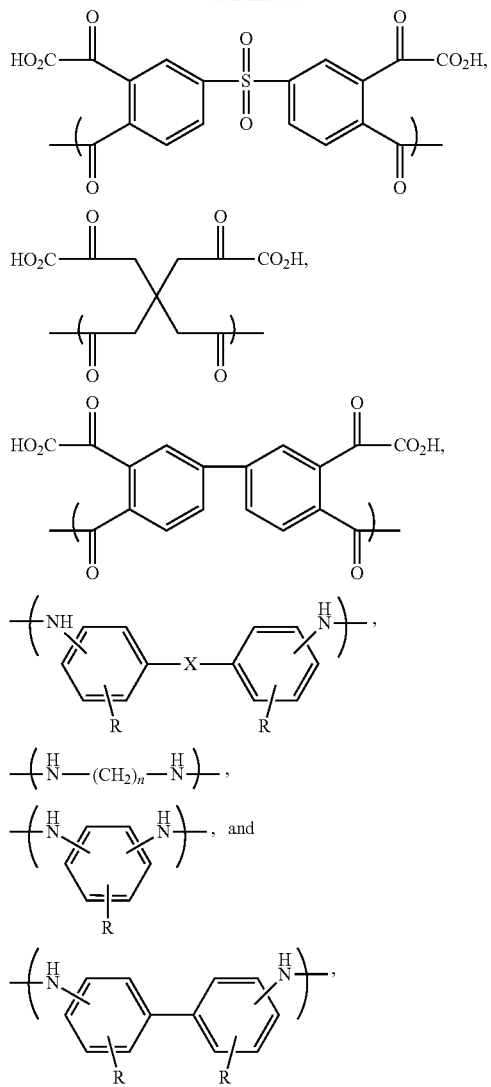

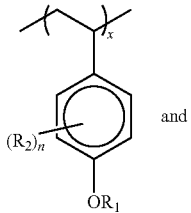

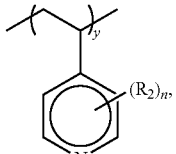

where:

X is selected from the group consisting of —O—, —S—, —CH$_2$—, —C(CF$_3$)$_2$—, and —C(CH$_3$)$_2$—;

n is 2-8; and each R is individually selected from the group consisting of —H and —OH.

Non-covalently crosslinkable (e.g., hydrogen bonded) polymers, can also be used in the inventive methods. The terms "non-covalent crosslinking," "non-covalently crosslinked," or "non-covalently crosslinkable" are used herein to refer to crosslinking that does not involve the intimate sharing of pairs of electrons, as in covalent bonding, but rather involves more dispersed variations of electromagnetic interactions. Preferred examples of non-covalent crosslinking include hydrogen bonding and electrostatic intermolecular attraction. In general, once crosslinked, these compounds will comprise linkages having the formula selected from the group consisting of —OH—O, —OH—N, —NH—O, or —NH—N, and combinations of the foregoing. Particularly preferred non-covalently crosslinkable polymers will comprise recurring monomers of In the above formulas, n is 0-4, and the the molar ratio of x:y is from about 1:3 to about 3:1. $R_1$ is a protecting group, and each $R_2$ is individually selected from the group consisting of alkyls, halogens, —OH, and multifunctional phenols. Exemplary protecting groups are selected from the group consisting of

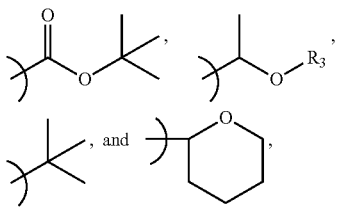

where $R_3$ is selected from the group consisting of alkyls.

Compounds for use in anti-reflective coatings and gap-fill compositions suitable for the invention can be crosslinkable. Thus, in some embodiments, the compositions will also comprise a crosslinking agent dispersed or dissolved in the solvent system with the compound. Suitable crosslinking agents include aminoplasts (e.g., POWDERLINK 1174, CYMEL, both from Cytec Industries), multi-functional epoxies (e.g., CY179MA from Vantico, MY720 from Ciba-Geigy), cyanurates (triepoxy propyl isocyanurate), and vinyl ethers, with vinyl ethers and epoxies being particularly preferred. An example of a commercially-available vinyl ether includes those sold under the trade name VECTomer™ (Aldrich; St. Louis, Mo.).

Particularly preferred vinyl ether crosslinkers for use in the compositions have the formula

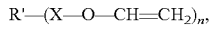

where R' is selected from the group consisting of aryls (preferably C$_6$-C$_{14}$) and alkyls (preferably C$_1$-C$_{18}$, and more preferably C$_1$-C$_{10}$), each X is individually selected from the group consisting of alkyls (preferably C$_1$-C$_{18}$, and more preferably C$_1$-C$_{10}$), alkoxys (preferably C$_1$-C$_{18}$, and more preferably C$_1$-C$_{10}$), carbonyls, and combinations of two or more of the foregoing, and n is at least 2, and preferably from 2-6. The most preferred vinyl ethers include those selected from the group consisting of ethylene glycol vinyl ether, trimethylolpropane trivinyl ether, 1,4-cyclohexane dimethanol divinyl ether, and mixtures thereof. Another preferred vinyl ether has a formula selected from the group consisting of

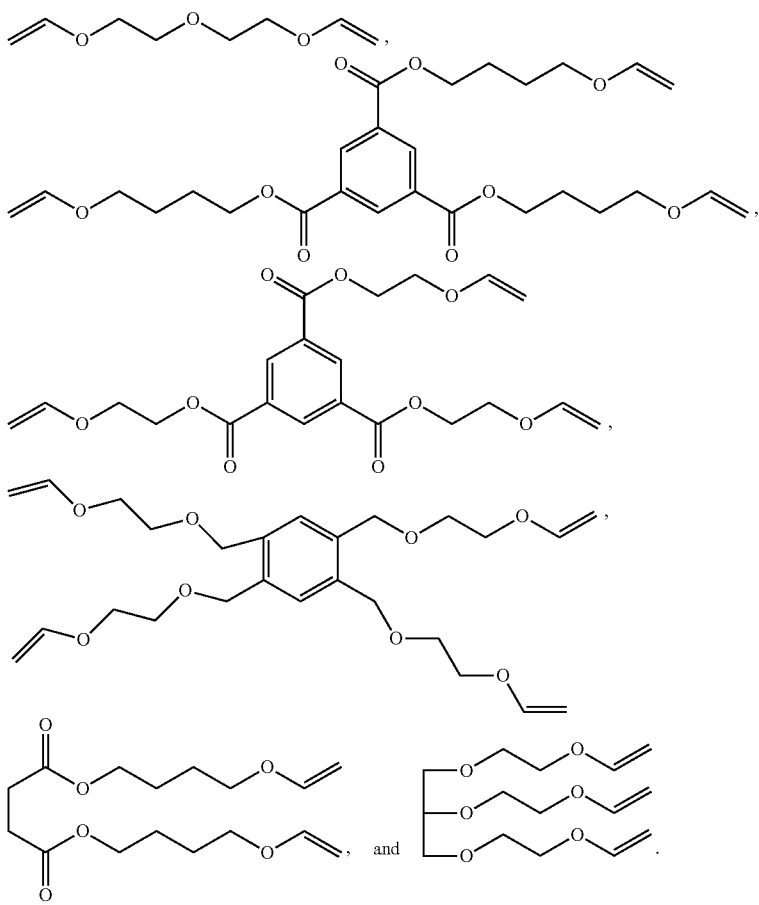

In these embodiments, the developer-soluble protective layer undergoes crosslinking during baking to yield a crosslinked or cured layer, as described above. The cured layer must be decrosslinked to be rendered developer soluble. This reaction scheme is depicted below.

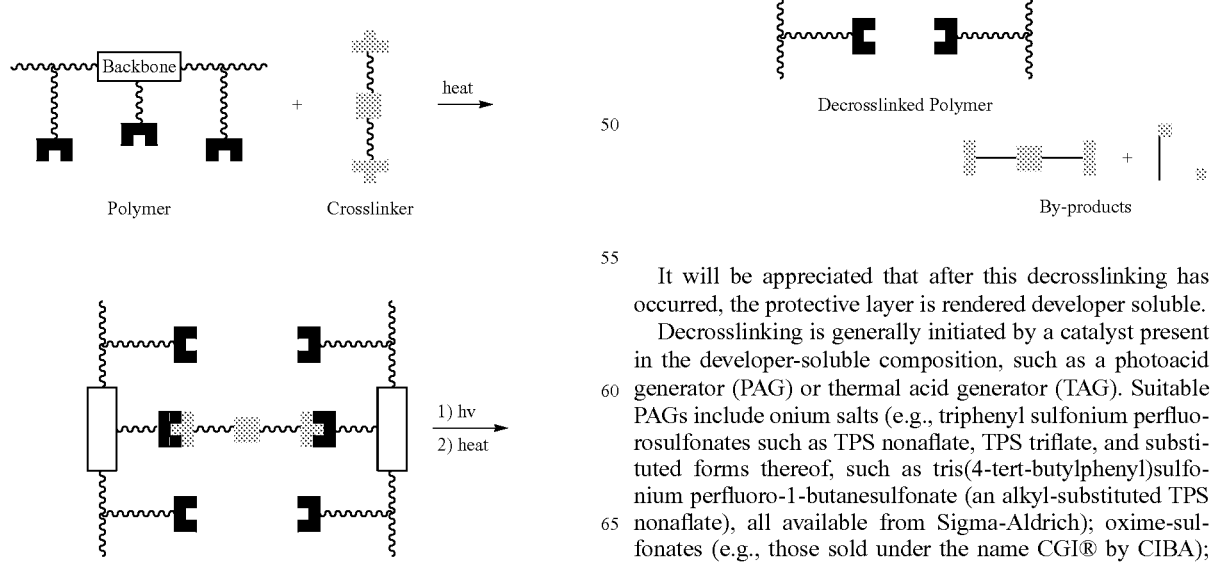

It will be appreciated that after this decrosslinking has occurred, the protective layer is rendered developer soluble.

Decrosslinking is generally initiated by a catalyst present in the developer-soluble composition, such as a photoacid generator (PAG) or thermal acid generator (TAG). Suitable PAGs include onium salts (e.g., triphenyl sulfonium perfluorosulfonates such as TPS nonaflate, TPS triflate, and substituted forms thereof, such as tris(4-tert-butylphenyl)sulfonium perfluoro-1-butanesulfonate (an alkyl-substituted TPS nonaflate), all available from Sigma-Aldrich); oxime-sulfonates (e.g., those sold under the name CGI® by CIBA); triazines (e.g., TAZ108® available from Midori Kagaku Company); and combinations thereof. Suitable TAGs include sulfonic acids (e.g., sulfonic esters, p-toluenesulfonic acid, dinonylnaphthalenesulfonic acid), triflic acids, and the like available under the name K-PURE® sold by King Industries. Upon exposure to light, an acid is generated from the acid generator, and this acid "decrosslinks" the compound in the layer. That is, the acid catalyzes breaking of the bond that was formed between the compound and the crosslinker upon thermal crosslinking. When the polymer or oligomer comprises an acid group, such as a carboxylic acid, decrosslinking results in the formation of the same polymer or oligomer originally present in the composition as well as an alcohol and an acetylaldehyde.

In some embodiments, such as the non-covalently crosslinkable compositions, the composition self-crosslinks without the aid of a crosslinking agent. Thus, in other aspects of the invention, including non-covalently crosslinkable as well as non-photosensitive embodiments, the developer-soluble composition is preferably substantially free of crosslinking agents. The compositions can also be substantially free of acid generators (e.g., PAGs, TAGs, etc.). "Substantially free" means that the compositions include less than about 0.1% by weight, preferably less than about 0.05%, and preferably about 0% by weight of the ingredient, based upon the total weight of the composition taken as 100% by weight. The composition can also be substantially free of other agents capable of initiating crosslinking/decrosslinking, either thermally or via light exposure.

Anti-reflective coating compositions will also typically comprise a chromophore (light attenuating compound or moiety). The chromophore can be bonded with the compound (either to a functional group on the compound or directly to the polymer backbone or oligomer core), or the chromophore can simply be physically mixed in the composition. The chromophore is selected based upon the wavelength at which the compositions will be processed. For example, at wavelengths of 248 nm, preferred chromophores include naphthalenes (e.g., naphthoic acid methacrylate, 3,7-dihydroxynaphthoic acid), heterocyclic chromophores, carbazoles, anthracenes (e.g., 9-anthracene methyl methacrylate, 9-anthracenecarboxylic acid), and functional moieties of the foregoing. At wavelengths of 193 nm, preferred chromophores include substituted and unsubstituted phenyls, heterocyclic chromophores (e.g., furan rings, thiophene rings), and functional moieties of the foregoing.

Additional ingredients that can be present in the composition include surfactants, adhesion promoters, or surface modifiers.

Regardless of the embodiment, the compositions are formed by simply dispersing or dissolving the polymers, oligomers, or mixtures thereof in a suitable solvent system, preferably at ambient conditions and for a sufficient amount of time to form a substantially homogeneous dispersion. The other ingredients (e.g., crosslinker, PAG) are preferably dispersed or dissolved in the solvent system along with the compound.

Preferred solvent systems include a solvent selected from the group consisting of propylene glycol methyl ether acetate (PGMEA), propylene glycol methyl ether (PGME), propylene glycol n-propyl ether (PnP), ethyl lactate, cyclohexanone, Gamma butyrolactone (GBL), and mixtures thereof. The solvent system should be utilized at a level of from about 80-99% by weight, and preferably from about 95-99% by weight, based upon the total weight of the composition taken as 100% by weight. Thus, the compositions typically have a solids content of from about 1-20% by weight, and preferably from about 1-5% by weight, based upon the total weight of the composition taken as 100% by weight.

Suitable developer-soluble compositions for use in the inventive methods are disclosed in U.S. Pat. Nos. 6,872,506, 7,261,997, 7,364,835, 7,601,483, and 7,914,974, as well as U.S. Pat. App. Pub. Nos. 2007-0207406 and 2009/0035590, incorporated by reference herein in their entireties.

EXAMPLES

The following examples set forth methods in accordance with the invention. It is to be understood, however, that these examples are provided by way of illustration and nothing therein should be taken as a limitation upon the overall scope of the invention.

Example 1

Multilayer Process Using a Thin Carbon Underlayer

A commercially-available developer-soluble coating (polyamic acid anti-reflective coating; ARC® DS-K101-307; Brewer Science Inc., Rolla, Mo.), was spin coated onto a 200-mm diameter silicon substrate at 1,500 rpm for 30 seconds using a TEL ACT8 clean track. The coated substrate was then transferred by the track to a bake plate and baked at 180° C. for 60 seconds, followed by 30 seconds on a 21° C. chill plate to quench the bake step. The resulting coating had a thickness of 70 nm. A spin-on carbon ("SOC") underlayer (Optistack® SOC 110D-322; Brewer Science Inc.), was then spin coated onto the developer-soluble coating at 1,500 rpm for 30 seconds. The film was then baked at 180° C. for 60 seconds, followed by quenching on a 21° C. chill plate for 30 seconds, to produce a 220-nm SOC film. A hardmask layer (Optistack® HM710-304.8; Brewer Science, Rolla, Mo.) was then coated at 2,500 rpm for 30 seconds. The coating was then baked at 180° C. for 60 seconds, followed by quenching on a 21° C. chill plate for 30 seconds to yield a 35-nm film. Finally, a photoresist layer (AR1682J-15; JSR, Sunnyvale, Calif.) was coated at 1,100 rpm for 30 seconds. The photoresist was then baked at 110° C. for 90 seconds, followed by quenching on a 21° C. chill plate for 30 seconds to produce a 200-nm film.

The photoresist was patterned using an ASML1100 ArF scanner, with conventional illumination, 0.0 µm focus, 0.74 NA, and 0.89 sigma. The scanner was set at 22 mJ/cm$^2$ and a 150-nm feature was targeted. After exposure, the stack was baked again at 110° C. for 90 seconds and chilled on a 21° C. chill plate for 30 seconds. The photoresist was then contacted with a 0.26N TMAH developer (OPD262; FujiFilm Electronic Materials, Japan) for 40 seconds, and rinsed with deionized water to resolve the pattern.

Figure 2:
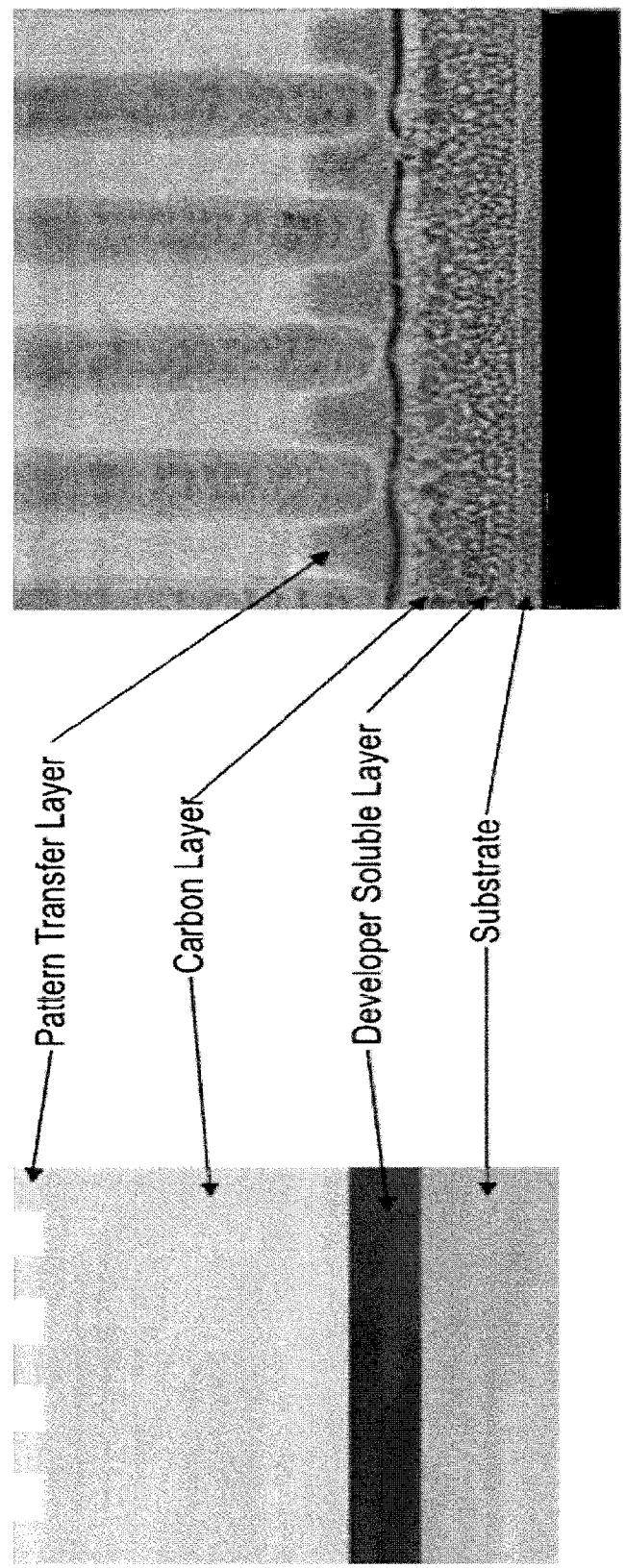
FIG. 2 is an annotated scanning electron microscope (SEM) photograph depicting a cross-sectional view of a stack from Example 1, along with a corresponding schematic drawing of the etch stack before pattern transfer.
Figure 3:
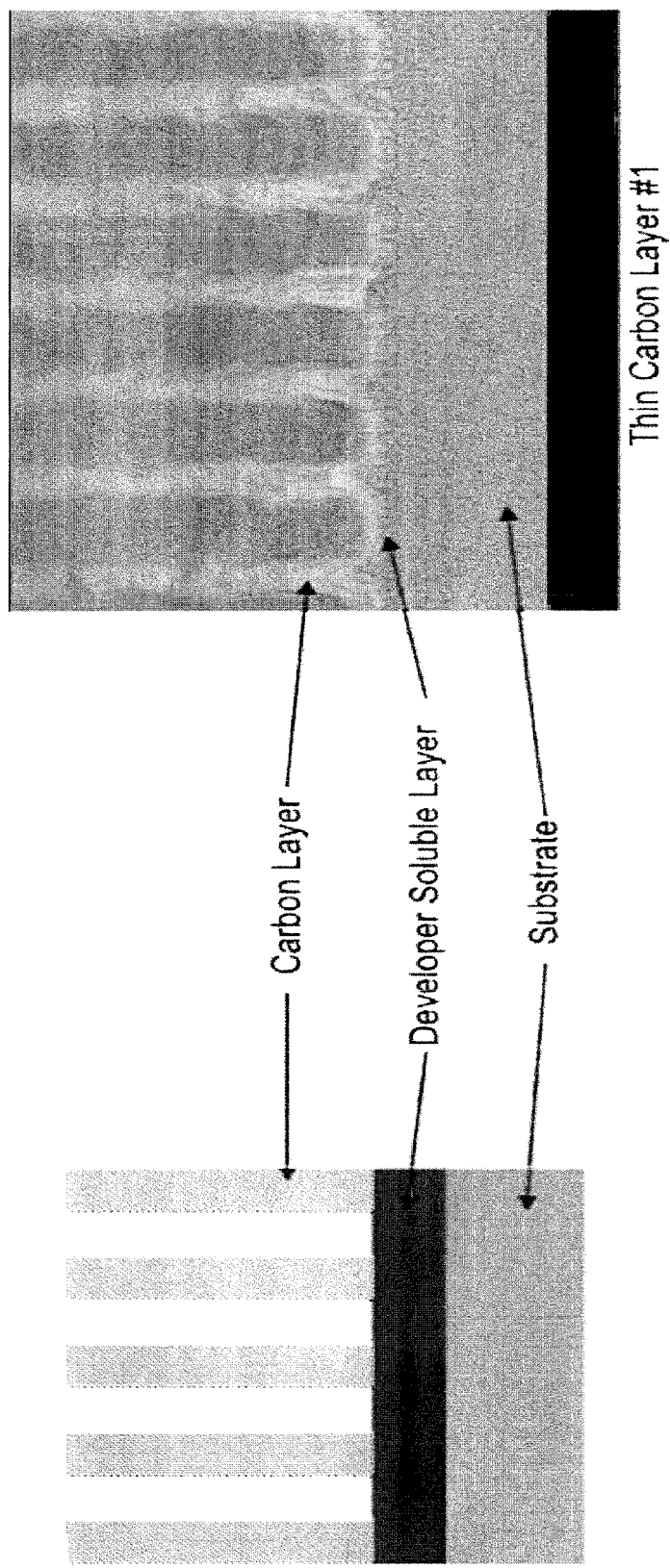
FIG. 3 is an annotated SEM photograph depicting a cross-sectional view of a stack from Example 1, along with a corresponding schematic drawing of an etch stack after pattern transfer using a 50-second etch.
Figure 4:
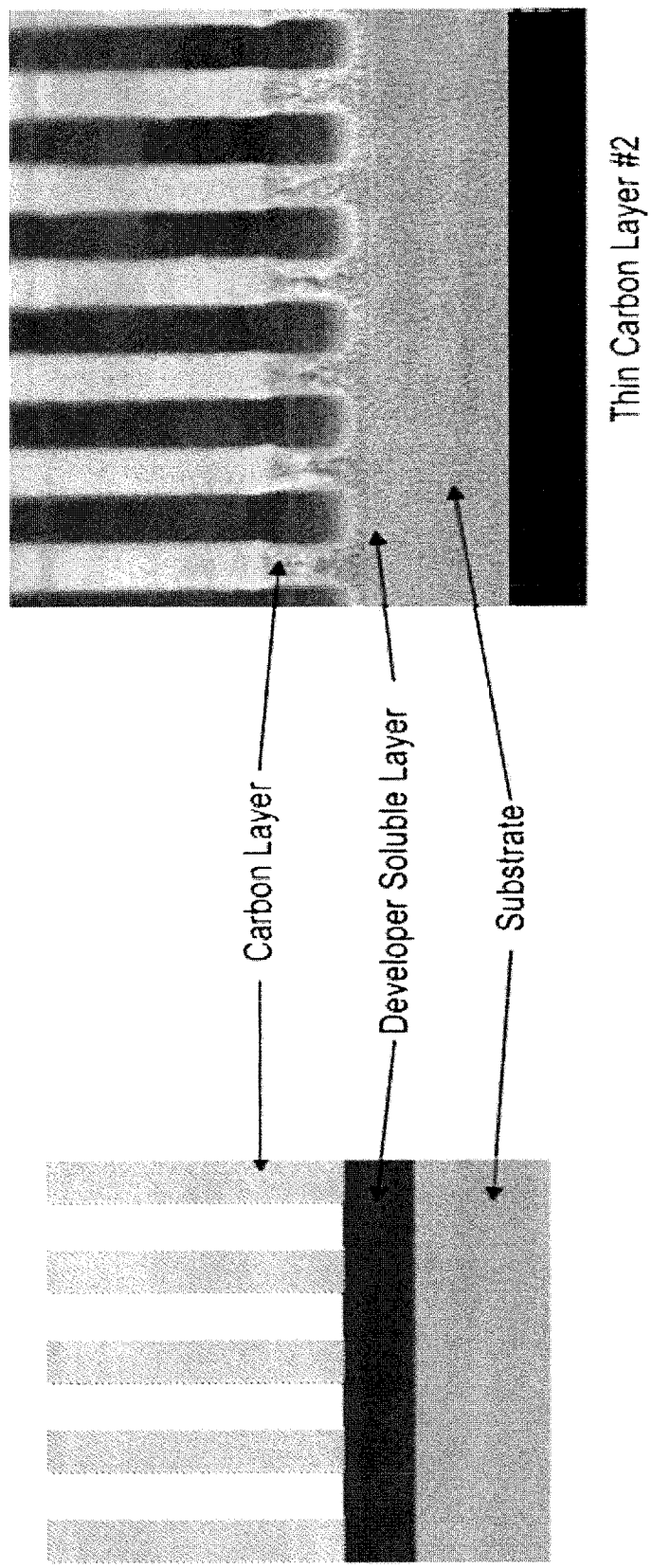
FIG. 4 is an annotated SEM photograph depicting a cross-sectional view of a stack from Example 1, along with a corresponding schematic drawing of an etch stack after pattern transfer using a 45-second etch.

Etching was then carried out using an Oxford Plasmalab 80 Plus etcher. The photoresist pattern was transferred into the hardmask (pattern transfer layer) using a CF$_4$ gas for 90 to 92 seconds at 50 mTorr, 35 sccm, and 100 watts. Multiple substrates were prepared and etched using the above process. FIG. 2 shows an annotated SEM photograph cross-section and accompanying schematic drawing of one stack at this stage in the process. The pattern was then etched into the carbon underlayer for 45 and 50 seconds using O$_2$ gas, 50 mTorr, 50 sccm, and 100 watts. FIG. 3 shows the cross section of a stack after a 50-second etch, and FIG. 4 shows the cross section of a different stack after a 45-second etch.

Example 2

Multilayer Process Using a Thick Carbon Underlayer

A commercially-available developer-soluble coating (polyamic acid anti-reflective coating; ARC® DS-K101-304; Brewer Science Inc.), was spin coated onto a 100-mm diameter silicon substrate at 1,500 rpm for 30 seconds using a Cee® 200CB coat-bake system (Brewer Science Inc.). The coated substrate was then transferred to a bake plate and baked at 175° C. for 60 seconds, followed by quenching on a 21° C. chill plate for 30 seconds, to yield a 40-nm film. A carbon underlayer (CS3076-68-1; Brewer Science Inc.) was spin coated at 1,700 rpm for 60 seconds onto the developer-soluble coating, using a 2,000 rpm/s acceleration. The layer was then baked at 100° C. for 60 seconds, followed by a 175° C. bake for 60 seconds to allow the thick film to fully cure. The stack was then chilled on a 21° C. chill plate for 30 seconds, to yield a 1,584-nm film. A layer of hardmask (Optistack® HM710-304; Brewer Science Inc.) was then coated at 1,500 rpm for 30 seconds, followed by baking at 175° C. for 60 seconds to produce a 35-nm film. Finally, a photoresist (AR1682J-15; JSR) was spin coated at 1,000 rpm for 30 seconds onto the hardmask. The photoresist was then baked at 110° C. for 90 seconds, followed by chilling on a 21° C. chill plate for 30 seconds to produce a 200-nm film.

The photoresist was patterned using an Amphibian™ interferometer, with a 0.32 NA prism targeting 150-nm lines. After exposure, the photoresist was baked at 110° C. for 90 seconds, followed by chilling on a 21° C. chill plate for 30 seconds. The pattern was then resolved using a 0.26N TMAH developer (PD523AD; Moses Lake Industries, Wash.) for 60 seconds and rinsing with deionized water.

Figure 5:
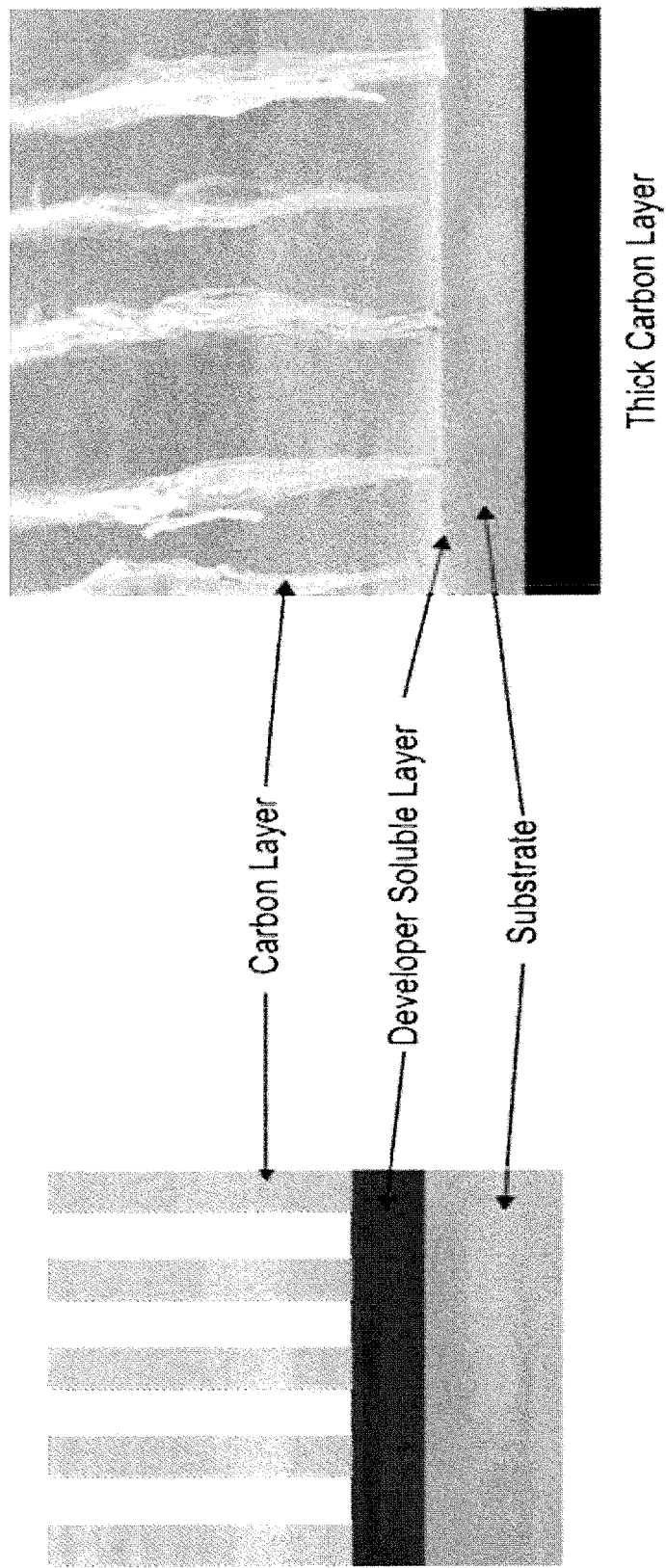
FIG. 5 is an annotated SEM photograph depicting a cross-sectional view of a stack from Example 2, along with a corresponding schematic drawing of the etch stack after pattern transfer.
Figure 6:
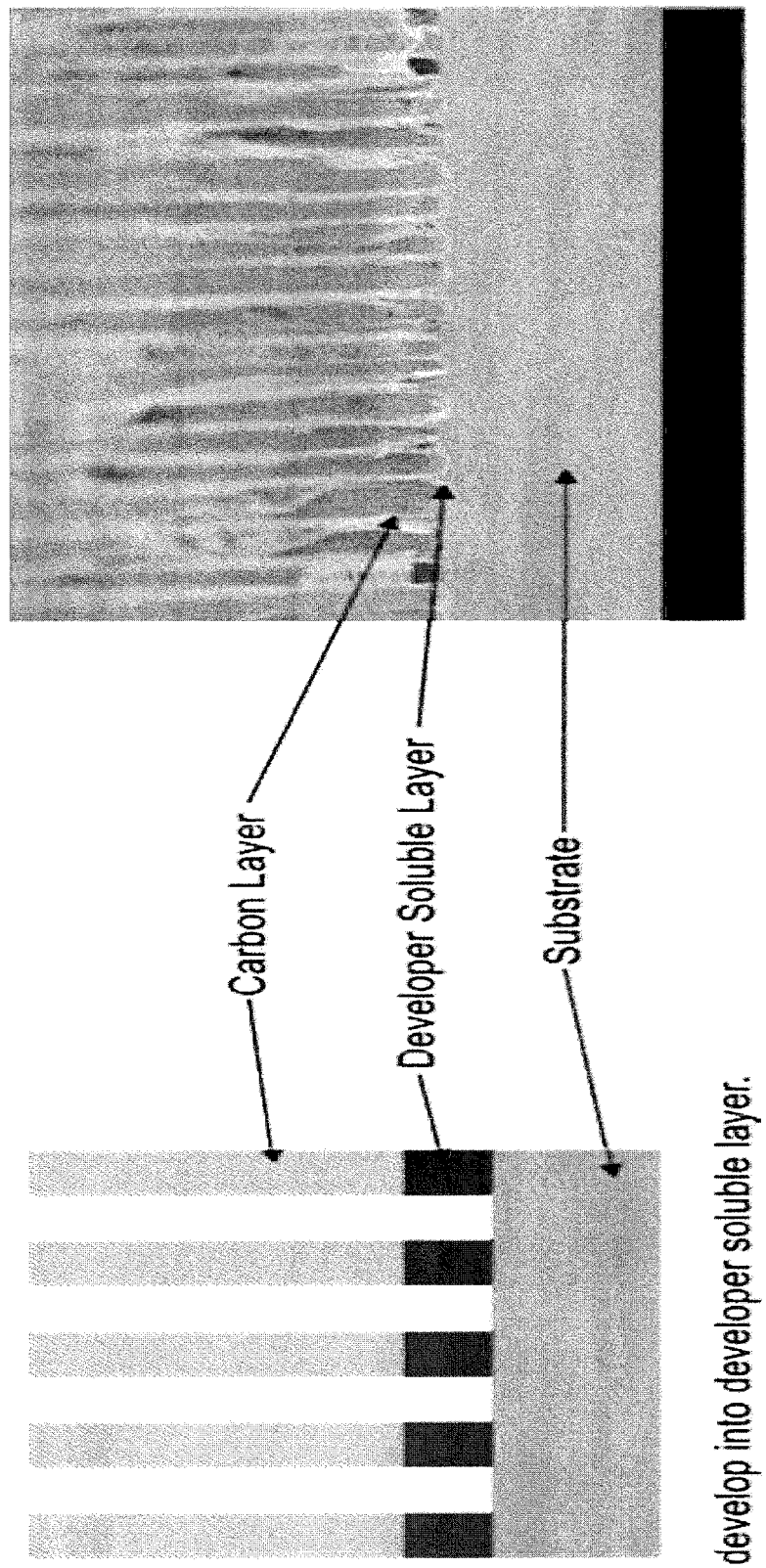
FIG. 6 is an annotated SEM photograph depicting a cross-sectional view of a stack from Example 2, along with a corresponding schematic drawing of the etch stack after removal of the developer-soluble protective layer.
Figure 7:
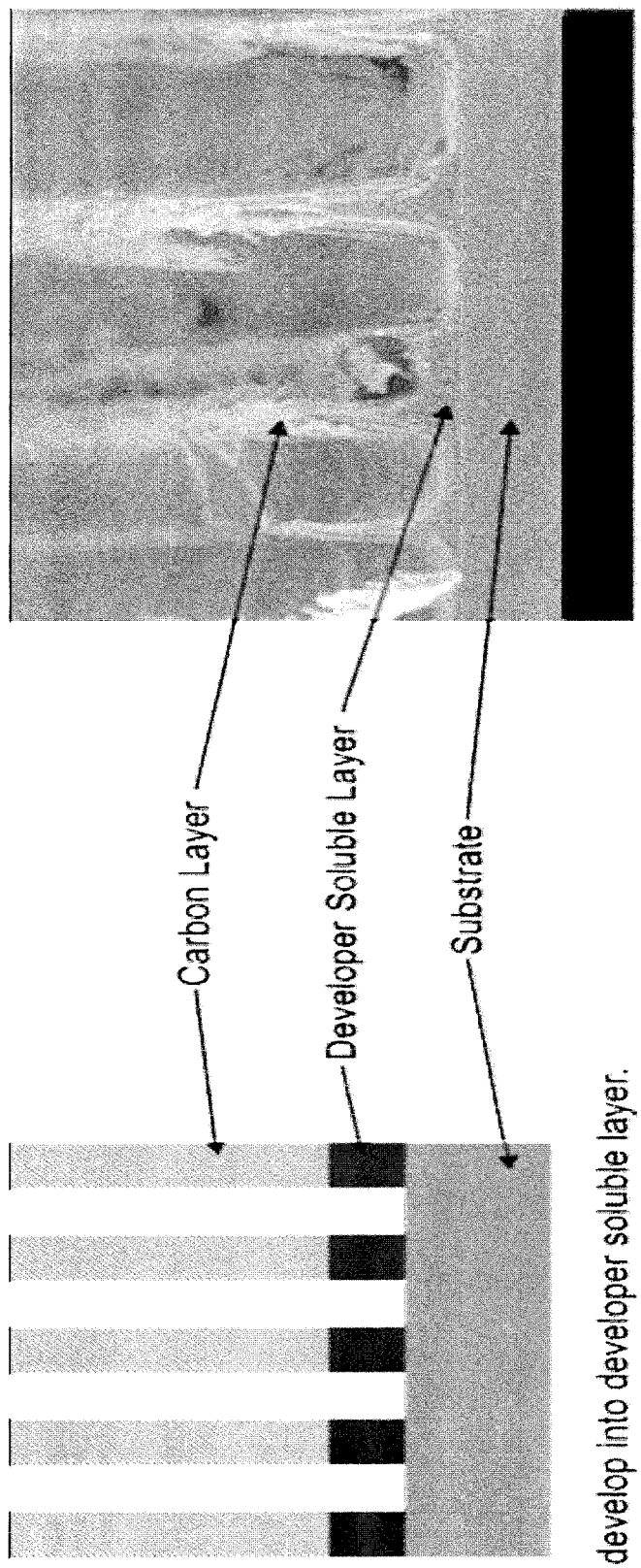
FIG. 7 is an enlarged view of the SEM photograph from FIG. 6, along with a corresponding schematic drawing of the etch stack after removal of the developer-soluble protective layer.

Etching was then carried out using an Oxford Plasmalab 80 Plus etcher. The photoresist pattern was transferred into the hardmask using a $CF_4$ gas for 90 to 92 seconds at 50 mTorr, 35 sccm and 100 watts. The pattern was then etched into the carbon layer for 5 to 10 minutes using $O_2$ gas at 60 mTorr, 50 sccm, and 300 watts. FIG. 5 shows an annotated SEM photograph cross-section and accompanying schematic drawing of the stack at this stage in the process. The stack was then rinsed with 0.26N TMAH developer (PD523AD) to transfer the pattern through the developer-soluble layer, followed by a deionized water rinse to clean the wafer. FIG. 6 shows an annotated SEM photograph cross-section and accompanying schematic drawing of the stack after developer removal of the developer-soluble underlayer. FIG. 7 show the SEM photograph cross-section and accompanying schematic drawing from FIG. 6, enlarged to show details of the developer-soluble layer.

Example 3

Developing High Aspect Ratio Features Using Megasonic Energy

A commercially-available developer-soluble anti-reflective coating (ARC® DS-K101-307; Brewer Science Inc.) was spin coated onto twenty-four 200-mm diameter silicon substrates at 1,500 rpm for 30 seconds using a TEL Mark 8 clean track. The coated substrates were then transferred by the track to a bake plate and baked under the following conditions: (1) six substrates at 170° C.; (2) six substrates at 175° C.; (3) six substrates at 180° C.; and (4) six substrates at 185° C., for 60 seconds respectively. The bake process was then quenched using a 21° C. chill plate for 30 seconds to yield a 40-nm film. The substrates where then transferred to the Cee® Model 100CB (Brewer Science Inc.) spin coat/bake combination tool, for spin coating a thick (1 μm) film of a commercially-available photoresist (M91Y-9cP; JSR). The film was formed by a static dispense (2 ml) at 0 rpm for 3 seconds, followed by casting/drying at 500 rpm at 1,000 rpm/s acceleration for 180 seconds, within an open bowl environment. The coated substrates where then transferred from the 100CB coat module, to the 100CB bake module for a soft gravity contact bake at 130° C. for 90 seconds.

All twenty-four wafers were then exposed using an Amphibian™ XIS KrF interferometer (Amphibian Systems), with a conventional dry process, 0.0 um focus, 0.31 NA, and a 6×6 dose meander, targeting 200-nm feature lines. After exposure, the substrates were subjected to a PEB at 130° C. for an additional 90 seconds through a soft gravity contact method. The substrates were then cooled under ambient conditions. The pattern was then resolved using either a standard developer puddle or a puddle/megasonic powered develop process. A 0.26N TMAH solution (PD523AD) was used as the developer.

A Cee® Model 200DB (Brewer Science Inc) was used to perform the standard puddle developer application for twelve control substrates (three substrates for each of the four anti-reflective coating bake conditions, with developer contact times of 5-, 10-, and 15-second, respectively). The first substrate in each temperature set was loaded into the 200DB system and puddled with developer solution for 5 seconds while spinning at 100 rpm. The substrate was then stopped and held statically at 0 RPM for a 5-second duration and then rinsed with deionized water for 13 seconds at 500 rpm at a 5,000 rpm/s acceleration. The substrate was then spun dry at 1,500 rpm using a 5,000 rpm/s acceleration, for a further 60 seconds. The second wafer from each temperature set was subjected to an identical process flow, with the exception of a 10-second static (0 rpm) developer puddle step. The third wafer in each temperature set was subjected to an identical process flow, with the exception of a 15-second static (0 rpm) developer puddle step.

Figure 8:
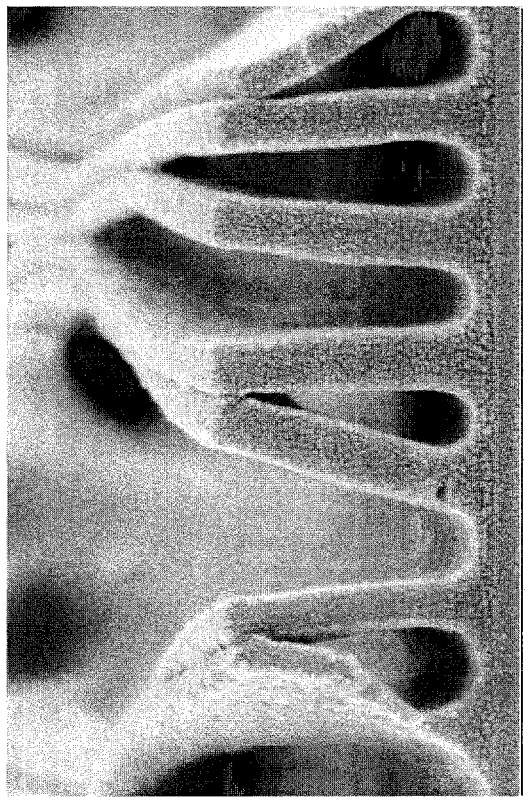
FIG. 8 shows side-by-side SEM cross-sectional images of substrates baked at 170° C. and subjected to a 15-second developer contact from Example 3.
Figure 8:
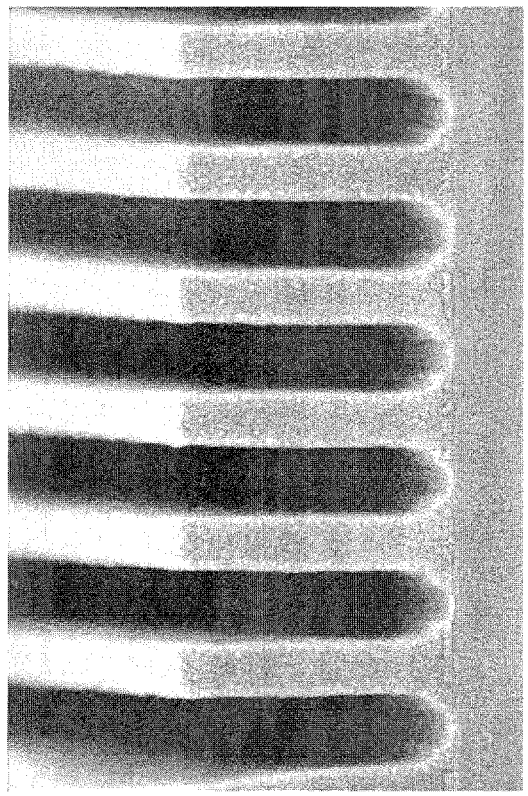
Figure 9:
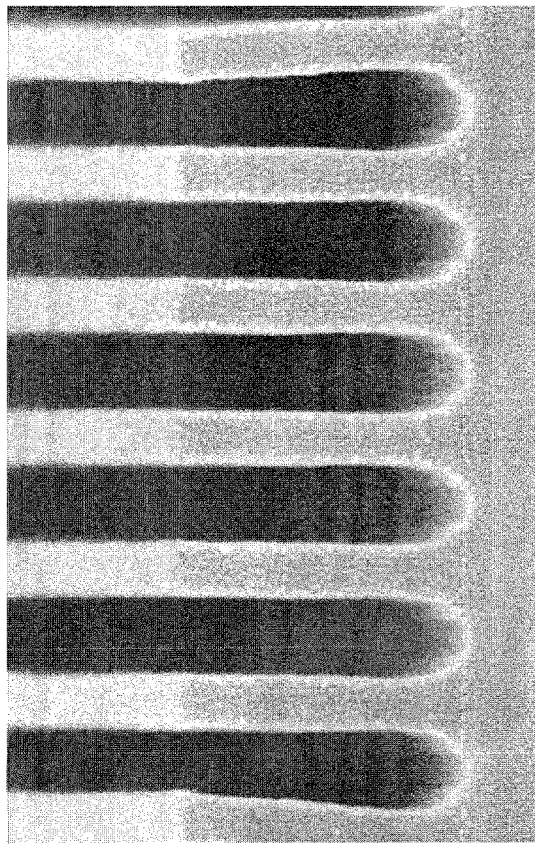
FIG. 9 shows side-by-side SEM cross-sectional images of substrates baked at 175° C. and subjected to a 15-second developer contact from Example 3.
Figure 9:
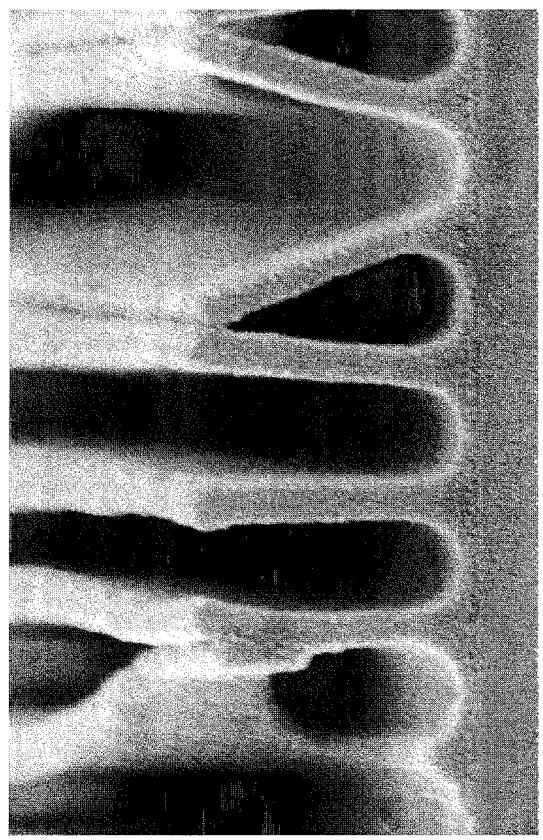
Figure 10:
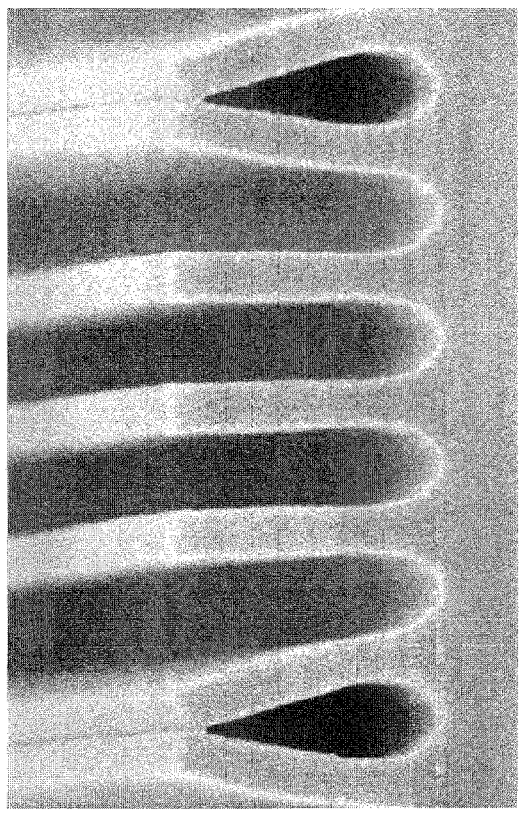
FIG. 10 shows side-by-side SEM cross-sectional images of substrates baked at 180° C. and subjected to a 15-second developer contact from Example 3.
Figure 10:
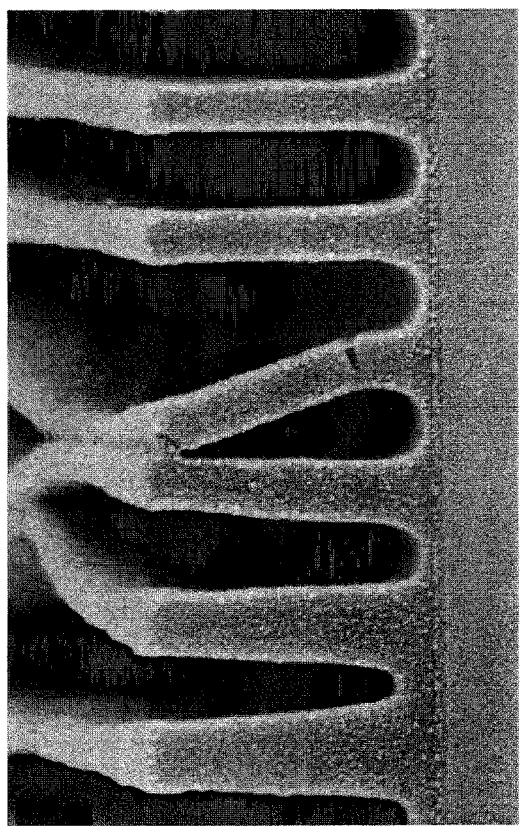
Figure 11:
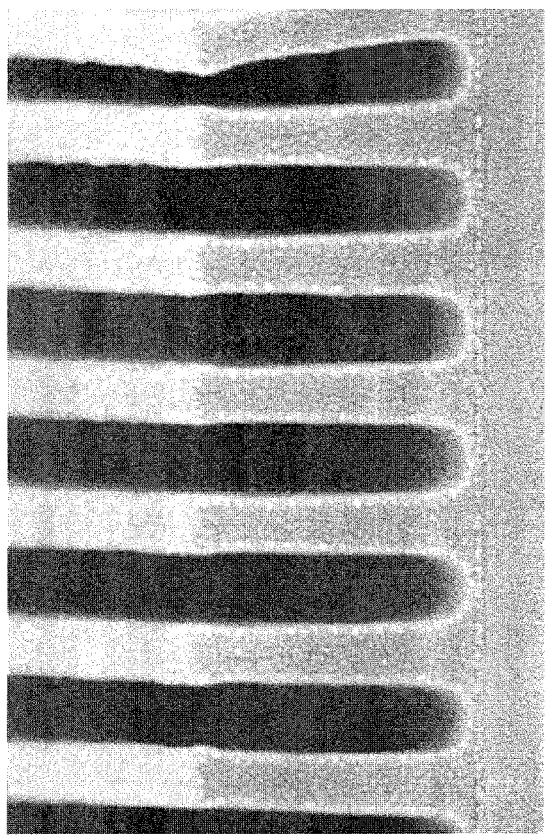
FIG. 11 shows side-by-side SEM cross-sectional images of substrates baked at 185° C. and subjected to a 15-second developer contact from Example 3.
Figure 11:
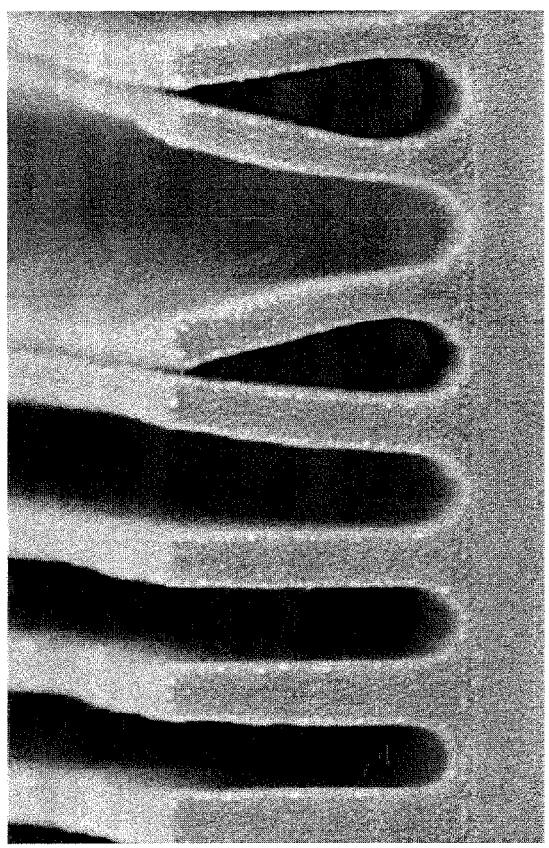

A Cee® Model 200FX-Developer (Brewer Science Inc.) with a Prosys Megpie 200/300 mm Dual Zone Transducer head (Product System Inc., Campbell, Calif.) was used to perform the megasonic energy enhanced developer process for twelve test substrates (three substrates for each of the four anti-reflective coating bake conditions, with developer contact times of 5-, 10-, and 15-second, respectively). The first substrate in each temperature set was loaded into the 200FX-Developer and developer solution was dispensed onto the surface for 5 seconds while spinning at 50 rpm. The developer flow was then stopped and the megasonic head was initiated for 5 seconds, using 15 watts of power, 10 millisecond Pulse width, 100% Duty Cycle, and <4 watts of reflective power. The substrate continued to spin at 50 rpm for the duration of the 5 second exposure to megasonic power. At the conclusion of the megasonic energy step, the substrate was spun at 500 rpm at 5,000 rpm/s acceleration and rinsed with deionized water for 13 seconds. The substrate was then spun dry at 1,500 rpm and 1,500 rpm/s acceleration, for 60 seconds. The second wafer from each temperature set was subjected to an identical process flow, with the exception of a 10-second megasonic powered/puddle developer step. The third wafer in each temperature set was subjected to an identical process flow, with the exception of a 15-second megasonic powered/puddle developer step. FIG. 8 shows side-by-side SEM cross-sectional images of (A) the standard-developed 15-second puddle/170° C. bake substrate; and (B) the megasonic energy developed 15-second puddle/170° C. bake substrate. FIG. 9 shows side-by-side SEM cross-sectional images of (A) the standard-developed 15-second puddle/175° C. bake substrate; and (B) the megasonic energy developed 15-second puddle/175° C. bake substrate. FIG. 10 shows side-by-side SEM cross-sectional images of (A) the standard-developed 15-second puddle/180° C. bake substrate; and (B) the megasonic energy developed 15-second puddle/180° C. bake substrate. FIG. 11 shows side-by-side SEM cross-sectional images of (A) the standard-developed 15-second puddle/185° C. bake substrate; and (B) the megasonic energy developed 15-second puddle/185° C. bake substrate. It can be seen from the SEM images that the megasonic energy developer process was better at removing the anti-reflective coating scum from the bottom of the high aspect features as compared to the standard developer process which still had scum remaining. The application of megasonic energy to the substrates also cleared the features without pulling them over.

We claim:

1. A method of forming a microelectronic structure, said method comprising:
    (a) providing a microelectronic substrate having a surface;
    (b) forming a developer-soluble protective layer on said surface;
    (c) forming a carbon-rich layer adjacent said developer-soluble protective layer;
    (d) forming a pattern transfer layer on said carbon-rich layer;
    (e) forming an imaging layer on said pattern transfer layer;
    (f) patterning said imaging layer to yield a patterned imaging layer comprising a pattern; said method further comprising:
        transferring said pattern into said pattern transfer layer and into said carbon-rich layer using etching, wherein etching of said carbon-rich layer yields uncovered portions of said developer-soluble protective layer, and wherein said developer-soluble protective layer protects said substrate from etch damage; and
        transferring said pattern into said developer-soluble protective layer by contacting said uncovered portions with a developer or solvent so as to remove said uncovered portions.

2. The method of claim 1, further comprising forming an etch block layer on said protective layer prior to forming said carbon-rich layer, said carbon-rich layer being formed on said etch block layer.

3. The method of claim 1, wherein said patterning comprises:
    exposing said imaging layer to radiation to yield exposed portions of said imaging layer; and
    contacting said imaging layer with a developer so as to remove said exposed portions and yield a patterned imaging layer, said patterned imaging layer comprising a pattern.

4. The method of claim 1, wherein said transferring said pattern into said pattern transfer layer comprises etching said pattern transfer layer with a gas selected from the group consisting of $CF_4$, $CHF_3$, $O_2$, HBr, $Cl_2$, $SF_6$, $C_2F_6$, $C_4F_8$, CO, $CO_2$, $N_2$, $H_2$, $C_4H_8$, Ar, $N_2H_2$, He, $CH_2F_2$, and mixtures thereof.

5. The method of claim 1, wherein said transferring said pattern into said carbon-rich layer comprises etching said carbon-rich layer with a gas selected from the group consisting of $CF_4$, $CHF_3$, $O_2$, HBr, $Cl_2$, $SF_6$, $C_2F_6$, $C_4F_8$, CO, $CO_2$, $N_2$, $H_2$, $C_4H_8$, Ar, $N_2H_2$, He, $CH_2F_2$, and mixtures thereof.

6. The method of claim 1, further comprising exposing said developer-soluble protective layer to radiation prior to said contacting to yield exposed portions of said developer-soluble protective layer corresponding to said uncovered areas, said exposed portions being removed by said developer during said contacting.

7. The method of claim 6, wherein said developer-soluble protective layer is crosslinked during said forming (b) and wherein said exposing results in the decrosslinking of said exposed portions.

8. The method of claim 1, wherein said developer is an aqueous alkaline developer.

9. The method of claim 1, wherein said developer is selected from the group consisting of potassium hydroxide, tetramethyl ammonium hydroxide, sodium hydroxide, and mixtures thereof.

10. The method of claim 1, wherein no etching occurs during said transferring of said pattern into said developer-soluble protective layer.

11. The method of claim 1, wherein said developer-soluble protective layer is formed from a composition comprising a compound dispersed or dissolved in a solvent system, said compound being selected from the group consisting of polymers and oligomers of polyamic acids, acrylates, methacrylates, polyesters, and mixtures thereof.

12. The method of claim 1, wherein said carbon-rich layer is not photosensitive.

13. A method of forming a microelectronic structure:
    providing a multilayer stack comprising:
        a substrate having a surface;
        a developer-soluble protective layer adjacent said substrate surface; and
        a patterned carbon-rich layer adjacent said developer-soluble protective layer, wherein carbon-rich layer is patterned by dry etching, said developer-soluble protective layer protecting said substrate from dry etch damage, said developer-soluble protective layer comprising covered and uncovered portions, said carbon-rich layer being adjacent said covered portions of said developer-soluble protective layer and absent from said uncovered portions of said developer-soluble protective layer; and
    transferring said pattern into said developer-soluble protective layer, wherein said transferring comprises contacting said developer-soluble protective layer with a developer to remove said uncovered portions from said substrate surface.

14. The method of claim 13, wherein said transferring further comprises exposing said developer-soluble layer to radiation prior to said contacting, said exposing yielding exposed portions of said developer-soluble protective layer corresponding to said uncovered portions, wherein said exposed portions are removed by said contacting.

15. The method of claim 13, wherein said transferring further comprises applying megasonic energy to said stack during said transferring.

16. The method of claim 13, said patterned carbon-rich layer having at least one opening formed therein, wherein said transferring yields a patterned developer-soluble protective layer having a least one opening formed therein, wherein said carbon-rich layer opening and said developer-soluble protective layer opening are substantially aligned.

17. The method of claim 16, further comprising:
    directing ions at the structure so as to cause at least some of the ions to become implanted within the substrate so as to form an ion implant area in the substrate, wherein said ion implant area is formed below said at least one developer-soluble protective layer opening.

18. The method of claim 13, wherein said patterned carbon-rich layer is not photosensitive.

* * * * *